US012687434B2

(12) United States Patent
Chanda et al.

(10) Patent No.: US 12,687,434 B2
(45) Date of Patent: Jul. 21, 2026

(54) FREQUENCY MODULATION BASED IR SENSING AND IMAGING AND RELATED METHODS

(71) Applicant: UNIVERSITY OF CENTRAL FLORIDA RESEARCH FOUNDATION, INC., Orlando, FL (US)

(72) Inventors: Debashis Chanda, Orlando, FL (US); Sayan Chandra, Orlando, FL (US); Tianyi Guo, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 395 days.

(21) Appl. No.: 18/329,061

(22) Filed: Jun. 5, 2023

(65) Prior Publication Data

US 2024/0044713 A1     Feb. 8, 2024

Related U.S. Application Data

(60) Provisional application No. 63/370,263, filed on Aug. 3, 2022.

(51) Int. Cl.
*G01J 5/02*          (2022.01)
*G01J 5/22*          (2006.01)
(Continued)

(52) U.S. Cl.
CPC . *G01J 5/02* (2013.01); *G01J 5/22* (2013.01); *H10N 70/026* (2023.02);
(Continued)

(58) Field of Classification Search
CPC ........ G01J 1/44; G01J 2001/4295; G01J 5/02; G01J 5/0225; G01J 5/22; G01J 5/24;
(Continued)

(56) References Cited

U.S. PATENT DOCUMENTS

| | | | | |
|---|---|---|---|---|
| 9,627,490 B1 * | 4/2017 | Eom | ...................... | H10D 62/80 |
| 10,101,212 B1 * | 10/2018 | Cleary | ...................... | G01J 5/20 |

(Continued)

OTHER PUBLICATIONS

Shabbir, Muhammad Waqas, Plasmonically enhanced spectrally selective narrowband MWIR and LWIR light detection based on hybrid nanopatterned graphene and phase changing vanadium oxide heterostructure operating close to room temperature. arXiv preprint arXiv:21 (Year: 2021).*

(Continued)

*Primary Examiner* — David J Makiya
*Assistant Examiner* — Soorena Kefayati
(74) *Attorney, Agent, or Firm* — Allen, Dyer, Doppelt + Gilchrist, PA

(57) ABSTRACT

An IR sensor comprises a substrate, a rear reflector on the substrate, a supporting layer a PCM layer carried by the supporting layer, and first and second electrically conductive contacts carried by the substrate and coupled to opposing sides of the PCM layer. The IR sensor also includes a circuit coupled to the first and second electrically conductive contacts and configured to apply an electrical bias signal to the PCM layer to generate an electrical oscillation, and detect the frequency modulation (FM) of the oscillation signal based upon IR radiation received by the PCM layer.

20 Claims, 30 Drawing Sheets

(51) Int. Cl.
    *H10N 70/00*       (2023.01)
    *H10N 70/20*       (2023.01)

(52) U.S. Cl.
    CPC ......... *H10N 70/231* (2023.02); *H10N 70/823*
        (2023.02); *H10N 70/8833* (2023.02)

(58) Field of Classification Search
    CPC ..... G01J 5/334; H10N 70/026; H10N 70/231;
              H10N 70/823; H10N 70/8833
    See application file for complete search history.

(56)            References Cited

U.S. PATENT DOCUMENTS

| | | | | |
|---|---|---|---|---|
| 10,600,959 | B2 * | 3/2020 | Shi | H10N 70/8836 |
| 11,662,504 | B2 * | 5/2023 | Kim | G02B 1/002 |
| | | | | 359/279 |
| 2007/0274121 | A1 * | 11/2007 | Lung | H10N 70/231 |
| | | | | 257/E45.002 |
| 2010/0227435 | A1 * | 9/2010 | Park | B24B 37/015 |
| | | | | 438/692 |
| 2010/0270529 | A1 * | 10/2010 | Lung | G11C 13/0004 |
| | | | | 257/E47.001 |
| 2011/0175047 | A1 * | 7/2011 | Ramanathan | H10N 70/20 |
| | | | | 977/773 |
| 2011/0266443 | A1 * | 11/2011 | Schimert | G01J 1/04 |
| | | | | 250/353 |
| 2013/0022077 | A1 * | 1/2013 | Harmon | G01J 5/20 |
| | | | | 374/178 |
| 2013/0314765 | A1 * | 11/2013 | Padilla | G02F 1/133377 |
| | | | | 428/209 |
| 2014/0269005 | A1 * | 9/2014 | Kang | H10P 50/73 |
| | | | | 257/4 |
| 2015/0116721 | A1 | 4/2015 | Kats et al. | |
| 2018/0045861 | A1 | 2/2018 | Caldwell et al. | |
| 2019/0316968 | A1 | 10/2019 | Baek et al. | |
| 2020/0209059 | A1 * | 7/2020 | Sarwat | H10N 70/231 |
| 2020/0227632 | A1 * | 7/2020 | Kim | G02B 1/002 |
| 2020/0269999 | A1 * | 8/2020 | Jankovic | B32B 3/30 |
| 2022/0147271 | A1 * | 5/2022 | Syed | G06F 3/0659 |
| 2022/0178756 | A1 | 6/2022 | Khan et al. | |

OTHER PUBLICATIONS

Duraffourg L, Array of Resonant Electromechanical Nanosystems: A Technological Breakthrough for Uncooled Infrared Imaging, Aug. 14, 2018, Micromachines (Basel), 2018;9(8):401 (Year: 2018).*
Wang et al. "Sensing Infrared Photons at Room Temperature: From Bulk Materials to Atomic Layers" Small 2019, 15, 1904396; pp. 22.
Larciprete et al. "Adaptive tuning of infrared emission using VO2 thin films" Scientific Reports: (2020) 10:11544; pp. 10.
Muzaffar et al. "Frequency modulated thermal wave imaging for visualizing power density of electromagnetic waves on plane surfaces" Research in Nondestructive Evaluation: 2019, vol. 30, No. 2, 65-79.
Junpeng Lu, "Highly sensitive and multispectral responsive phototransistor using tungsten-doped VO2 nanowires", Nanoscale, 6, 7619-7627 (Year: 2014).

* cited by examiner

1000

1010

1020

1030

1070

1100

1110

Pixel Size (8 x 8 μm)

1160

1170

1180

1190

306

301

FREQUENCY MODULATION BASED IR SENSING AND IMAGING AND RELATED METHODS

GOVERNMENT RIGHTS

This invention was made with government support under grant ECCS-2015722 awarded by National Science Foundation. The government has certain rights in the invention.

RELATED APPLICATION

This application is based upon prior filed Application No. 63/370,263 filed Aug. 3, 2022, the entire subject matter of which is incorporated herein by reference in its entirety.

TECHNICAL FIELD

The present disclosure relates to the field of radiation sensing, and, more particularly, to an infrared sensor and related methods.

BACKGROUND

Long wave-infrared (LWIR) detectors are integral components in various applications, for example, night vision, chemical sensing, spectroscopy, industrial inspection, space exploration, medical imaging, food evaluation technologies, security surveillance, firefighting, and defense-rated applications. LWIR detectors can be broadly categorized into two types: cooled and uncooled detectors, and both have their own limitations. Cooled detectors, predominantly fabricated using Mercury-Cadmium-Telluride (MCT), exhibit excellent detectivity ranging from $10^9$ to $10^{11}$ Jones. However, the requirement of cryogenic cooling may make them expensive and limit their practical utility. On the other hand, uncooled detectors, such as microbolometers, can operate at room temperature and are relatively cost effective. One drawback to microbolometers is that they suffer from low detectivity (i.e., about $10^8$ Jones) due to the higher thermal noise level intrinsic to room temperature operation. In some approaches, detectors may employ amplitude modulation (AM) detection of photocurrent, voltage, or resistance changes in response to light exposure. However, these AM-based detection techniques inherently suffer from Johnson noise, thermal noise, and shot noise.

SUMMARY

Generally, an IR sensor includes a substrate, a rear reflector on the substrate, a support layer carried by the substrate, a phase change material (PCM) layer carried by the support layer, first and second electrically conductive contacts carried by the substrate and coupled to opposing sides of the PCM layer, and a circuit coupled to the first and second electrically conductive contacts. The circuit is configured to apply an electrical bias signal to the PCM layer to generate an oscillation signal, and detect changes in the oscillation signal based upon IR radiation received by the PCM layer.

In particular, the circuit may be configured to cause the phase change of the PCM layer periodically and detect a frequency modulation (FM) of the oscillation signal based upon the IR radiation received by the PCM layer. The electrical bias signal may cause the PCM layer to change phase periodically.

In some embodiments, the IR sensor may include a rear reflector on the substrate and spaced apart from the PCM layer. The PCM layer and the rear reflector may define an optical cavity therebetween. The optical cavity may include an open optical cavity.

Also, the circuit may be configured to detect changes in the oscillation signal based upon LWIR radiation received by the PCM layer. The circuit may include a capacitor coupled in parallel to the first and second electrically conductive contacts, and a resistor coupled in parallel to the first and second electrically conductive contacts. For example, the PCM layer may include vanadium dioxide; the substrate may include silicon oxide; the support layer may include at least one of silicon oxide, silicon nitride, and sapphire; and the first and second electrically conductive contacts each may include chromium.

Another aspect is directed to a method for operating an IR sensor comprising a substrate, a support layer carried by the substrate, a PCM layer carried by the support layer, and first and second electrically conductive contacts carried by the substrate and coupled to opposing sides of the PCM layer. The method includes applying an electrical bias signal to the first and second electrically conductive contacts of the PCM layer to generate an oscillation signal, and detecting changes in the a frequency of the oscillation signal based upon IR radiation received by the PCM layer.

Yet another aspect is directed to a method for making an IR sensor comprising forming a rear reflector on a substrate, forming a support layer on the substrate, and forming a PCM layer on the support layer. The method comprises forming first and second electrically conductive contacts on the substrate and coupled to opposing sides of the PCM layer, and coupling a circuit the first and second electrically conductive contacts. The circuit is configured to apply an electrical bias signal to the PCM layer to generate an oscillation signal, and detect changes in a frequency of the oscillation signal based upon IR radiation received by the PCM layer.

DETAILED DESCRIPTION

Figure 1A:
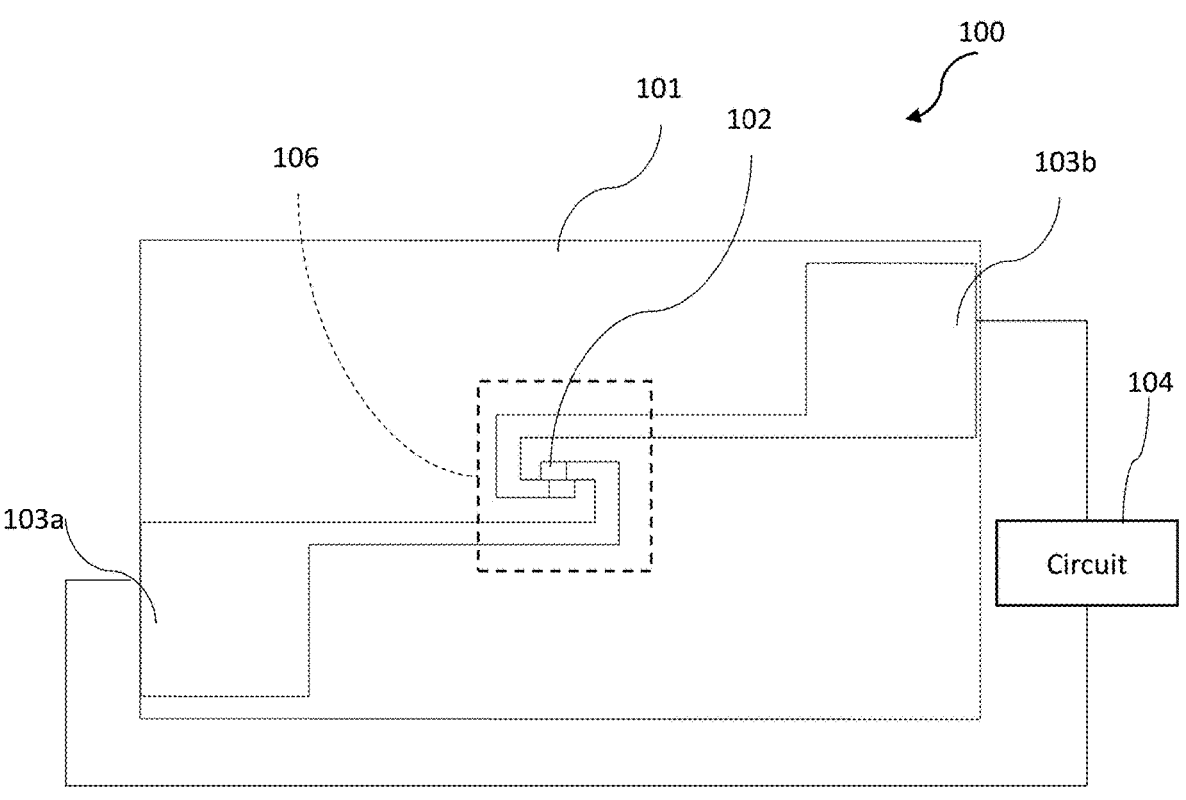
FIG. 1A is a schematic diagram of an IR sensor, according to a first embodiment of the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

In the present disclosure, an approach for an uncooled LWIR detector that offers high detectivity and better signal-to-noise response is disclosed. In particular, the approach comprises a frequency modulation-based LWIR detection scheme based on an oscillating circuit using a PCM. This approach relies on the oscillation FM of the circuit induced by IR photons instead of the conventional AM, and thus is inherently robust to AM noises. A PCM, for example, vanadium dioxide ($VO_2$), may be utilized to realize such an FM-based detection scheme. At room temperature, $VO_2$ is in its insulating phase possessing a monoclinic crystal structure with high resistance. However, when subjected to elevated thermal conditions, $VO_2$ undergoes an insulator-to-metal transition (IMT) to a rutile structure known as the metallic phase, displaying orders of magnitude lower resistance. With a reduced thermal condition, the transition is reversible from the metallic phase to the insulating phase (MIT). This thermally induced transition in $VO_2$ is exceptionally robust compared to other PCMs and with a low thermal hysteresis (5-8 K). In the phase transition range, $VO_2$ exhibits a negative differential resistance (NDR) behavior, where the differential resistance $\Delta V/\Delta I < 0$.

A combination of an NDR element with a capacitor creates an electrical oscillator circuit that can self-sustain current/voltage oscillation without the need for an external inductive component. In the case of $VO_2$, the repeated oscillation between the two phases occurs, with the IMT and the MIT following each other. Here, this oscillation is then used to detect an LWIR radiation by sensing changes in the frequency of the oscillating voltage as a function of incident IR irradiation. To enhance the optical absorption and sensitivity of the FM-based LWIR detector, the $VO_2$ thin film is placed on an optical cavity. The FM-based LWIR detection is achieved by tracking the change in oscillator frequency of the circuit with respect to the incident power while the $VO_2$ film is electrically biased in the high-temperature coefficient of resistance (TCR) at the IMT transition edge.

In an example embodiment, the room-temperature device exhibits a noise equivalent power (NEP) of less than 3 $pW \cdot Hz^{-1/2}$ and a high detectivity (D*) of the order of $10^9$ comparable to cryogenically cooled LWIR detectors. Helpfully, the disclosed embodiments may provide for highly sensitive, FM-based uncooled LWIR detectors that can be used in IR spectrometers for molecular sensing, medical diagnostics, and cameras for military and security applications.

Figure 1B:
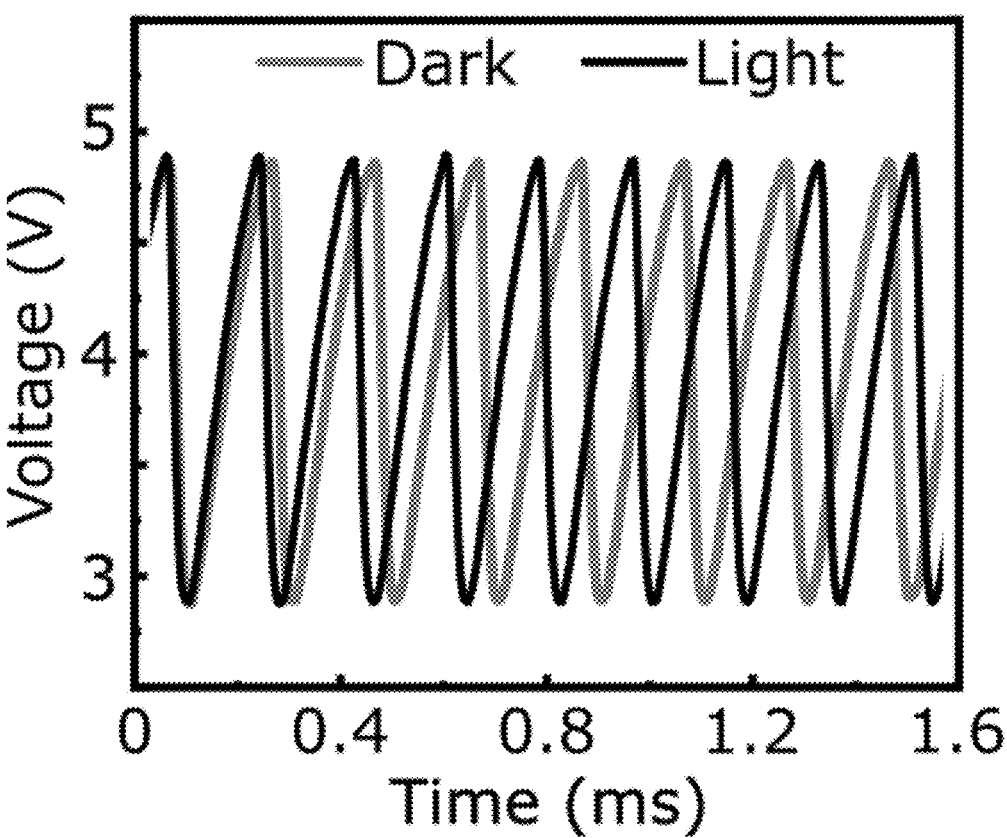
FIG. 1B is a diagram of an oscillation waveform in light and dark conditions by the IR sensor of FIG. 1A.
Figure 2A:
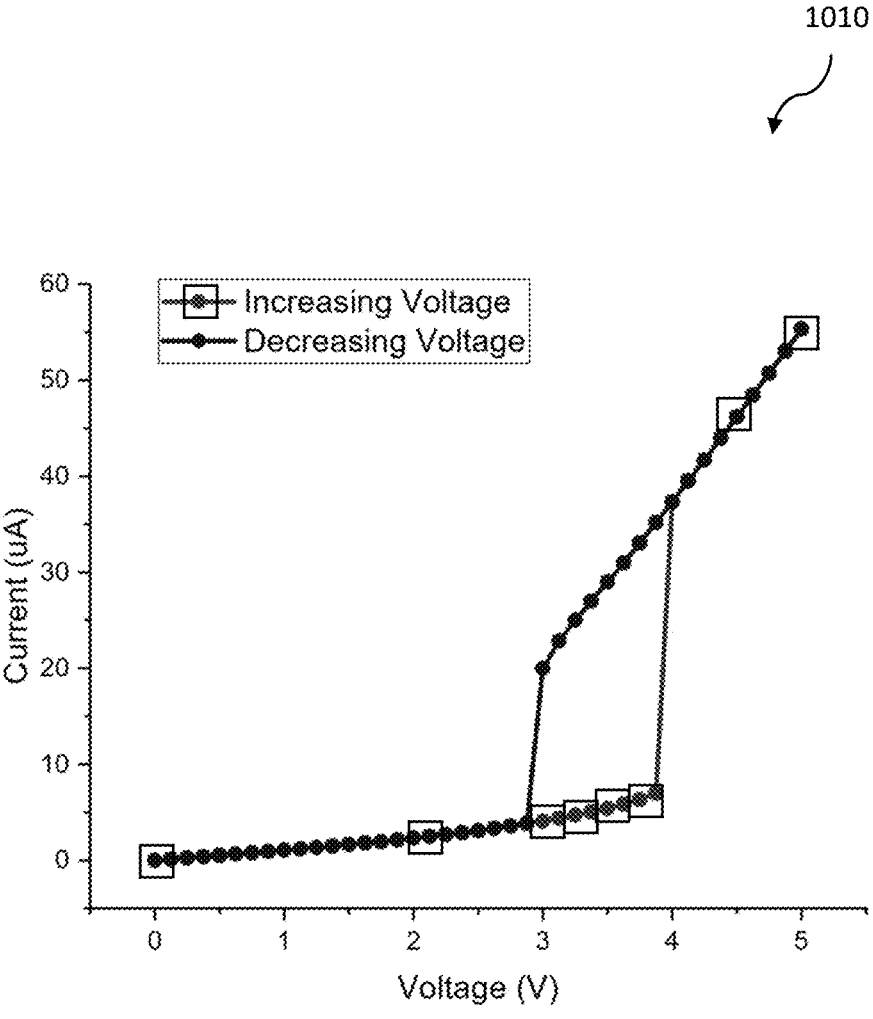
FIG. 2A is a diagram of a hysteresis loop of an example embodiment of the IR sensor, according to the present disclosure.
Figure 2B:
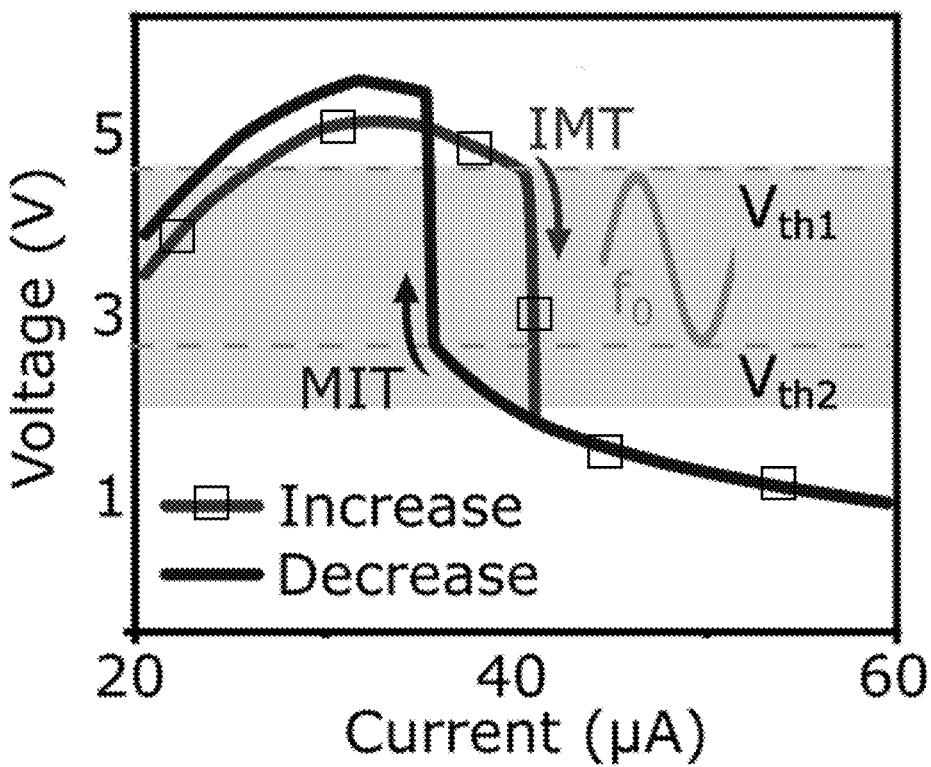
FIG. 2B is a diagram of a hysteresis loop in a current driven mode of an example embodiment of the IR sensor, according to the present disclosure.
Figure 2C:
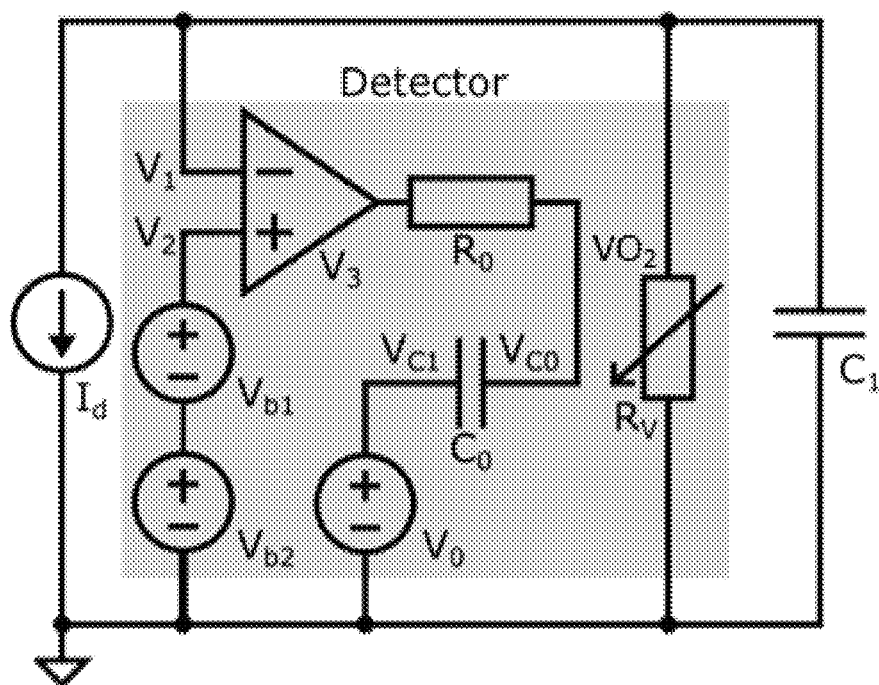
FIG. 2C is an equivalent circuit diagram representing the example embodiment of the IR sensor, according to the present disclosure.
Figure 2D:
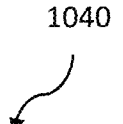
FIG. 2D is a diagram of simulated and experimental waveform in the example embodiment of the IR sensor, according to the present disclosure.
Figure 2D:
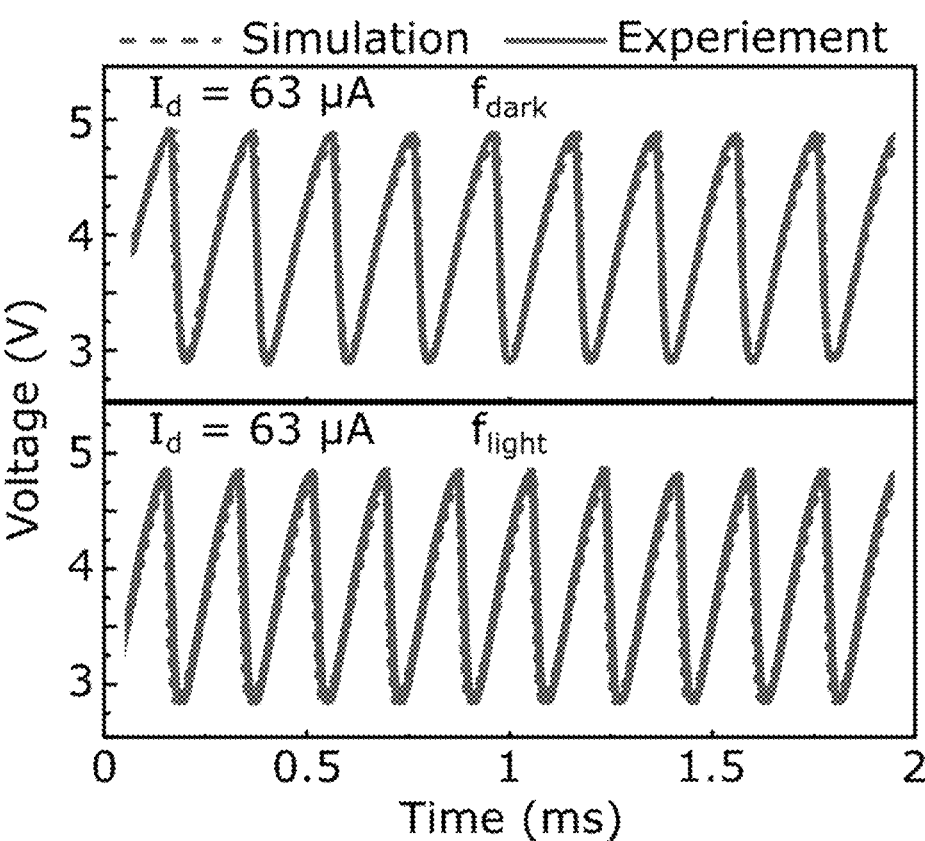

Referring initially to FIGS. 1A-1B, an IR sensor 100 comprises a substrate 101, a PCM layer 102 suspended by a supporting layer, and a mirror 106 on the substrate 101 and under the PCM layer 102. The supporting layer and first and second electrically conductive contacts 103a-103b are carried by the substrate 101, and the first and second electrically conductive contacts are coupled to opposing sides of the PCM layer. The IR sensor 100 illustratively includes a circuit 104 coupled to the first and second electrically conductive contacts 103a-103b and configured to apply an electrical bias signal to the PCM layer 102 to generate an electrical oscillation. The electrical bias signal places the PCM layer 102 in the high TCR semiconductor (S)-metal (M) transition (SMT) edge.

The circuit 104 is configured to detect changes in the oscillation frequency based upon IR radiation received by the PCM layer 102. The IR sensor 100 may sense, for example, LWIR radiation, midwave infrared (MWIR) radiation, and shortwave infrared (SWIR) radiation.

In some embodiments, the PCM layer 102 may comprise vanadium dioxide ($VO_2$). Of course, other PCMs may be used in other embodiments. Also, each of the first and second electrically conductive contacts 103a-103b may comprise one or more of gold, silver, copper, aluminum, and nickel. Also, the substrate 101 may comprise one or more of silicon oxide ($SO_2$), silicon nitride (SiN), and Sapphire ($Al_2O_3$).

Another aspect is directed to a method for operating an IR sensor 100 comprising a substrate 101, a PCM layer 102 carried by the substrate, and first and second electrically conductive contacts 103a-103b carried by the substrate and coupled to opposing sides of the PCM layer. The method comprises applying an electrical bias signal to the PCM layer 102 to generate an electrical oscillation, and detecting changes in the oscillation frequency based upon IR radiation received by the PCM layer. Diagram 1000 shows the changes in the oscillation frequency based upon received IR radiation.

In particular, a novel optical antenna array may allow efficient broadband light coupling across LWIR band (or MWIR, SWIR) to the underline $VO_2$ PCM, which triggers electronic oscillation. Tracking the change in the oscillator FM with respect to incident IR radiation while the $VO_2$ system is electrically biased in the high TCR semiconductor (S)-metal (M) transition (SMT) edge, offers significantly higher noise performance compared to the typical amplitude modulation (AM) based IR detection.

The constant self-oscillation between S and M states, circumvents the minor hysteresis loop problem, which is a major hindrance to any PCM's usage for photodetection. Overall, this FM high sensitivity IR detection scheme may add an unexplored dimension to room temperature IR detection and imaging techniques. The FM ($\Delta f$) based IR detection scheme may offer noise resistance and higher photon detection sensitivity ($\Delta f/P_{IR}$).

Figure 3A:
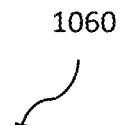
FIG. 3A is a diagram of measured and simulated absorption in the example embodiment of the IR sensor, according to the present disclosure.
Figure 3A:
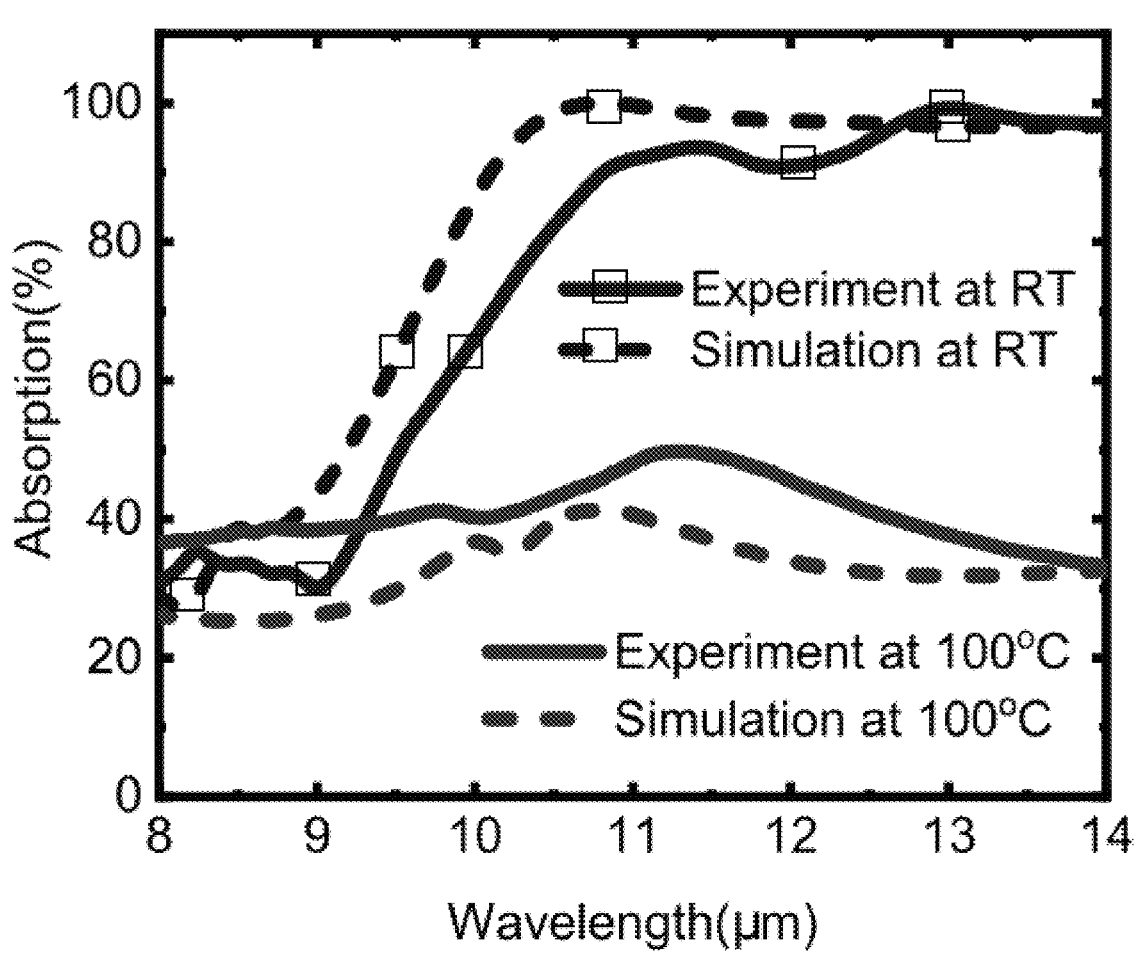
Figure 3B:
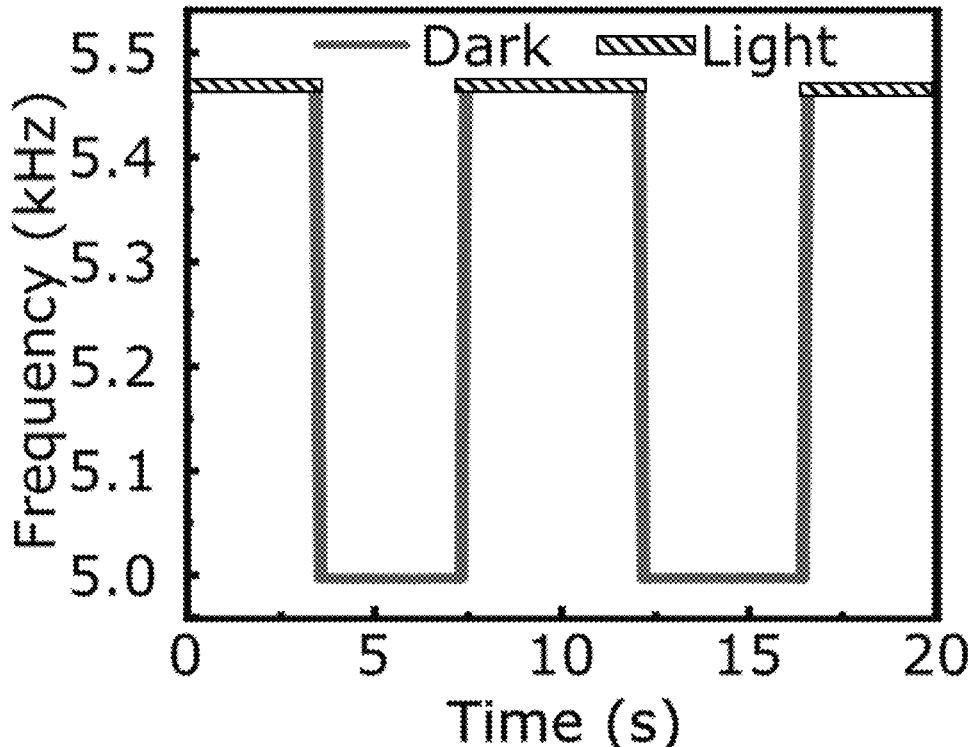
FIG. 3B is a diagram of circuit oscillation frequency change in dark and light conditions for the example embodiment of the IR sensor, according to the present disclosure.

Referring now to FIGS. 2A-2D, diagrams 1010, 1020, 1030, 1040 show the operation and simulation of an example embodiment of the IR sensor 100. Referring now to FIGS. 3A-3B, diagrams 1060, 1070 show the measurements for absorption and light detection of the example embodiment of the IR sensor 100. In diagram 1070, the oscillation frequency changes between light and dark conditions, achieving light detection.

Referring now to FIGS. 4A-4D, diagrams 1080, 1100, 1110, 1120 how device characterization and expected performance of the example embodiment of the IR sensor 100. In diagram 1080, it is shown that there is no oscillation in the circuit below or above the threshold current. In diagram 1100, responsivity is plotted to zero when the circuit is not oscillating.

Figure 5A:
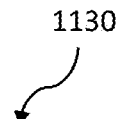
FIG. 5A is a diagram of peak-to-peak frequency of the waveform in FIG. 5A as a function of time.
Figure 5A:
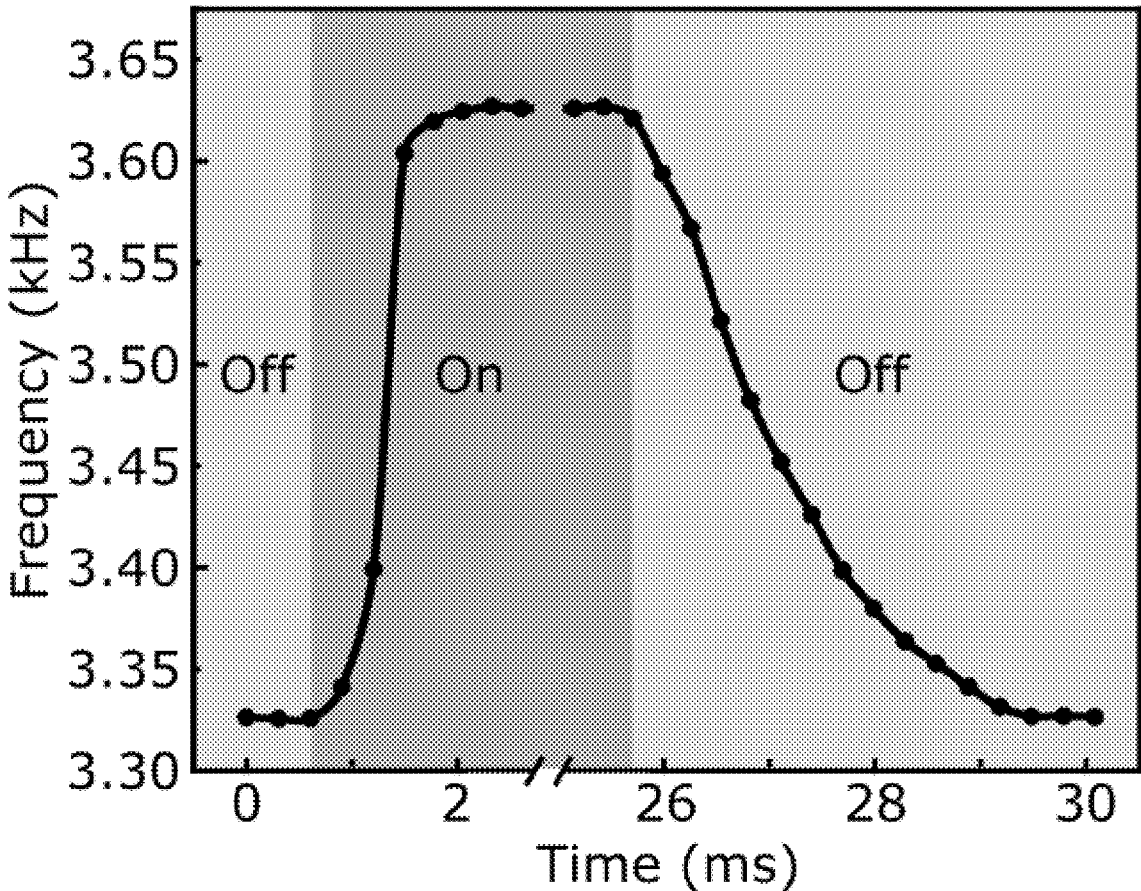
Figure 5B:
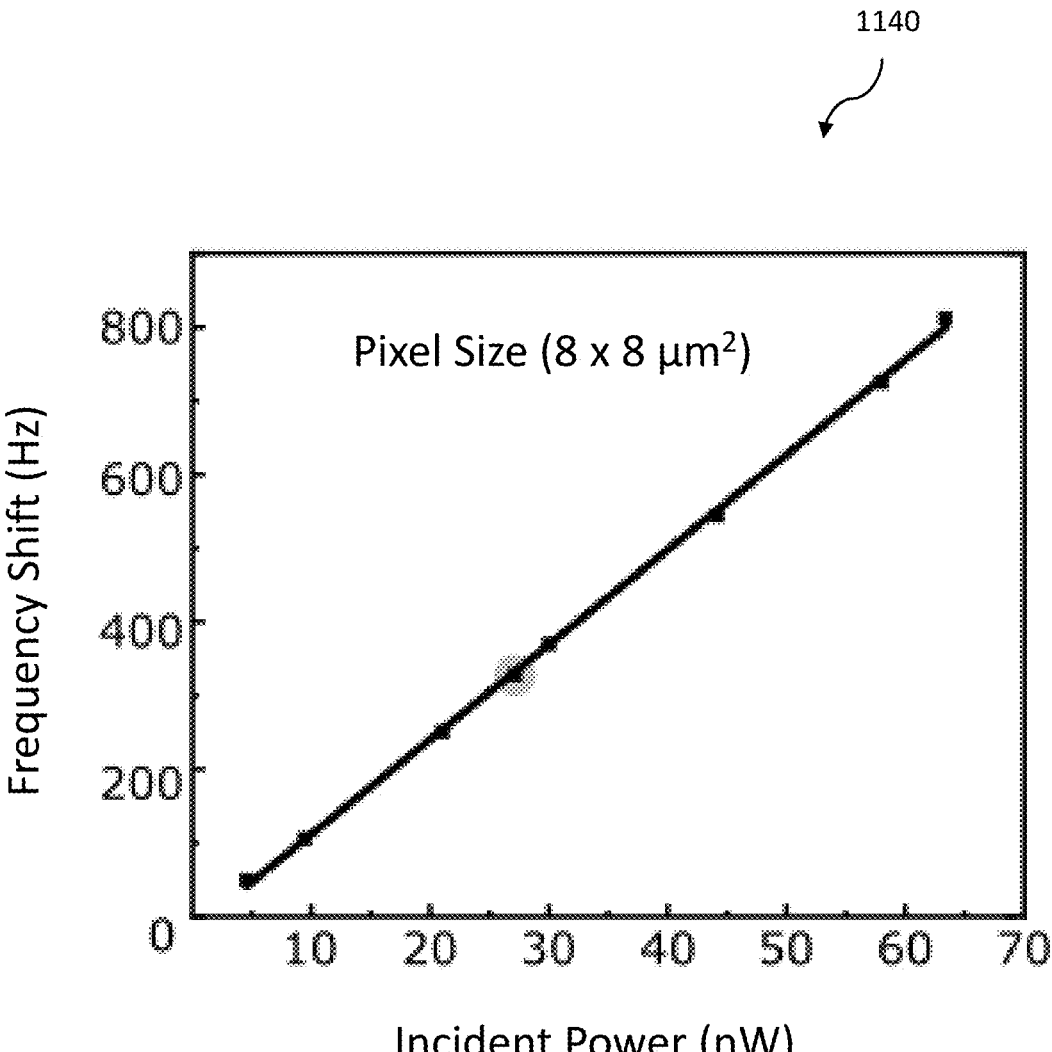
FIG. 5B is a diagram of frequency shift plot as a function of power in the example embodiment of the IR sensor, according to the present disclosure.
Figure 5C:
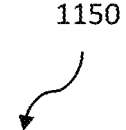
FIG. 5C is a diagram of beam profile mapping with a XY translation stage to calibrate the incoming light power in the example embodiment of the IR sensor, according to the present disclosure.
Figure 5C:
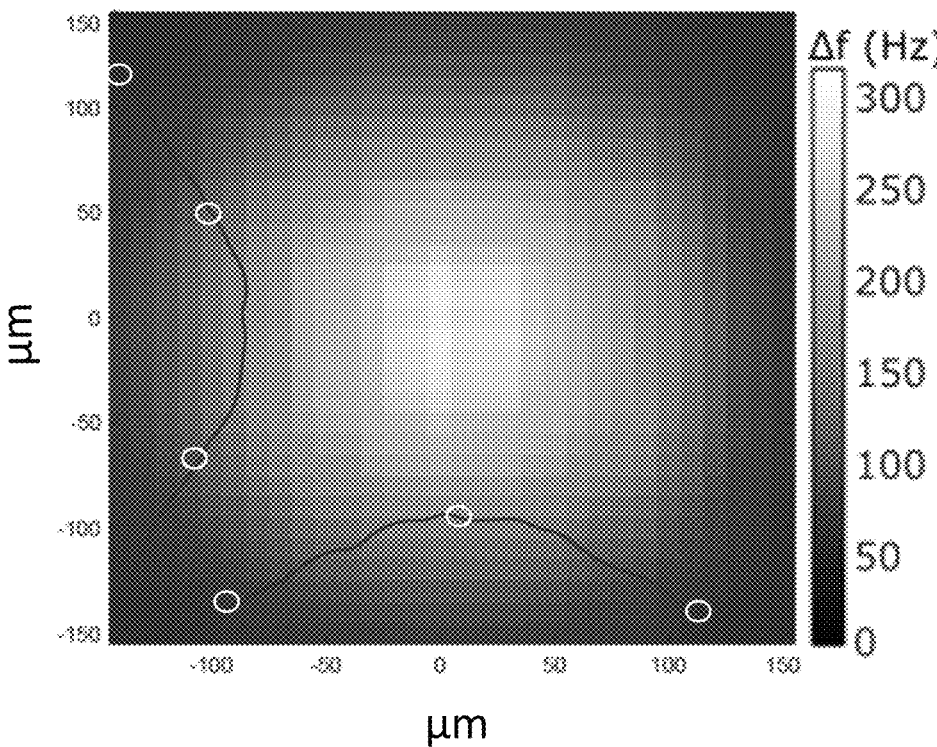

Referring now to FIGS. 5A-5C, diagrams 1130, 1140, 1150 show device time response and power scaling in the example embodiment of the IR sensor 100. Diagram 1130 shows oscillation frequency change with light on at about 2.9 ms for the IR sensor, according to the present disclosure. In diagram 1140, the frequency shift plots as a function of power indicates a linear response of the IR sensor 100 (e.g., with pixel size 8×8 $\mu m^2$). In diagram 1150, the beam profile mapping is shown with an XY translation stage to calibrate the incoming light power. Here, the line profile at X=0 and Y=0 is plotted with a circle hatched curve inside the map.

Advantageously, the IR sensor 100 may provide a broadband printed thin-film optical antenna for efficient lens-less IR light coupling. As will be appreciated, IR light collection is critical for higher SNR. The IR sensor 100 may provide for a printed array of multi-layer optical antenna, which offers broadband light coupling to the underneath detection layer. The IR sensor 100 may provide an FM based novel, low noise detection scheme. This is in contrast to existing detectors, which function based on AM. Typical detectors have performance that is limited by the AM noise (e.g., Johnson noise, shot noise, background fluctuation noise etc.).

Moreover, the IR sensor 100 may provide room temperature sensitivity. In particular, a sensitivity of 63 Hz/mK is measured (i.e., about 10 mK temperature difference for 6 Hz frequency shift) in preliminary testing, which is comparable to existing cryogenically cooled (77 K) IR detector sensitivity (i.e., about 10 mK) but at room temperature. Also, the IR sensor 100 may provide for low SWaP since the FM circuitry is well matured and readily available in integrated circuit format.

Figure 7A:
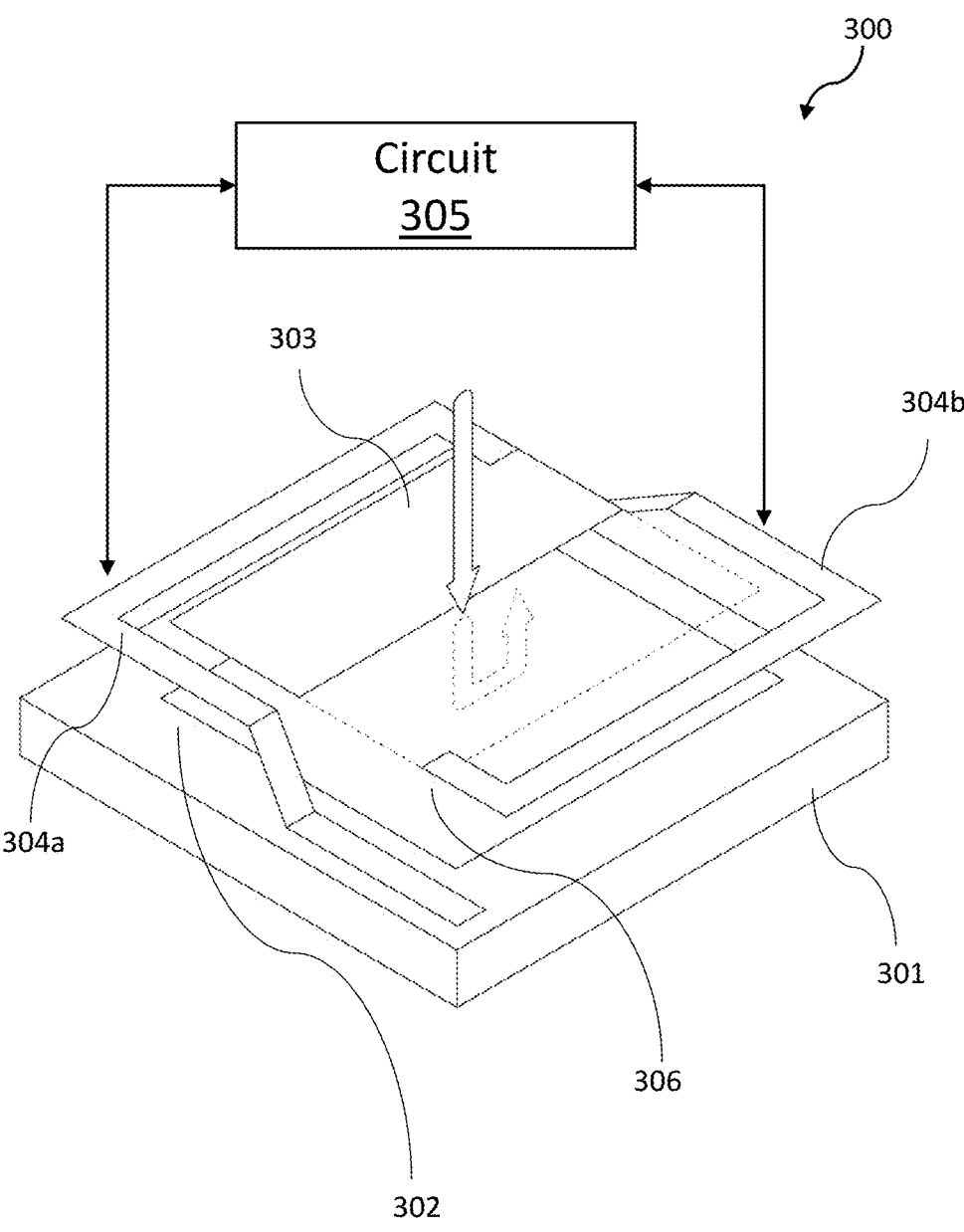
FIG. 7A is a schematic perspective view of the IR sensor, according to a third embodiment of the present disclosure.

Referring now to FIG. 7A, an FM-based LWIR detector 300 is shown. An 8×8 $\mu m^2$ $VO_2$ thin film is suspended with a $Si_3N_4$ support layer on top of an air spacer. An Au mirror is used as a back reflector. The Au mirror and air spacer together form an optical cavity. A part of the $VO_2/Si_3N_4$ stack in the schematic is shown with transparency to clearly show the presence of the optical cavity. The incident IR radiation (indicated by the arrow) is partially absorbed and partially transmitted through the thin film stack. The transmitted wave is then reflected by the back mirror.

Depending on the cavity phase, a constructive interference between the reflected wave and incident wave intensifies the electromagnetic field at the suspended $VO_2/Si_3N_4$ stack interface resulting in an enhancement in absorption. The mechanical suspension of the $VO_2$ thin film is critically important to reduce thermal mass and localize the absorbed energy for higher sensitivity. Finally, chromium electrodes were fabricated on the sides of the $VO_2$ film for electrical connections.

Figure 7B:
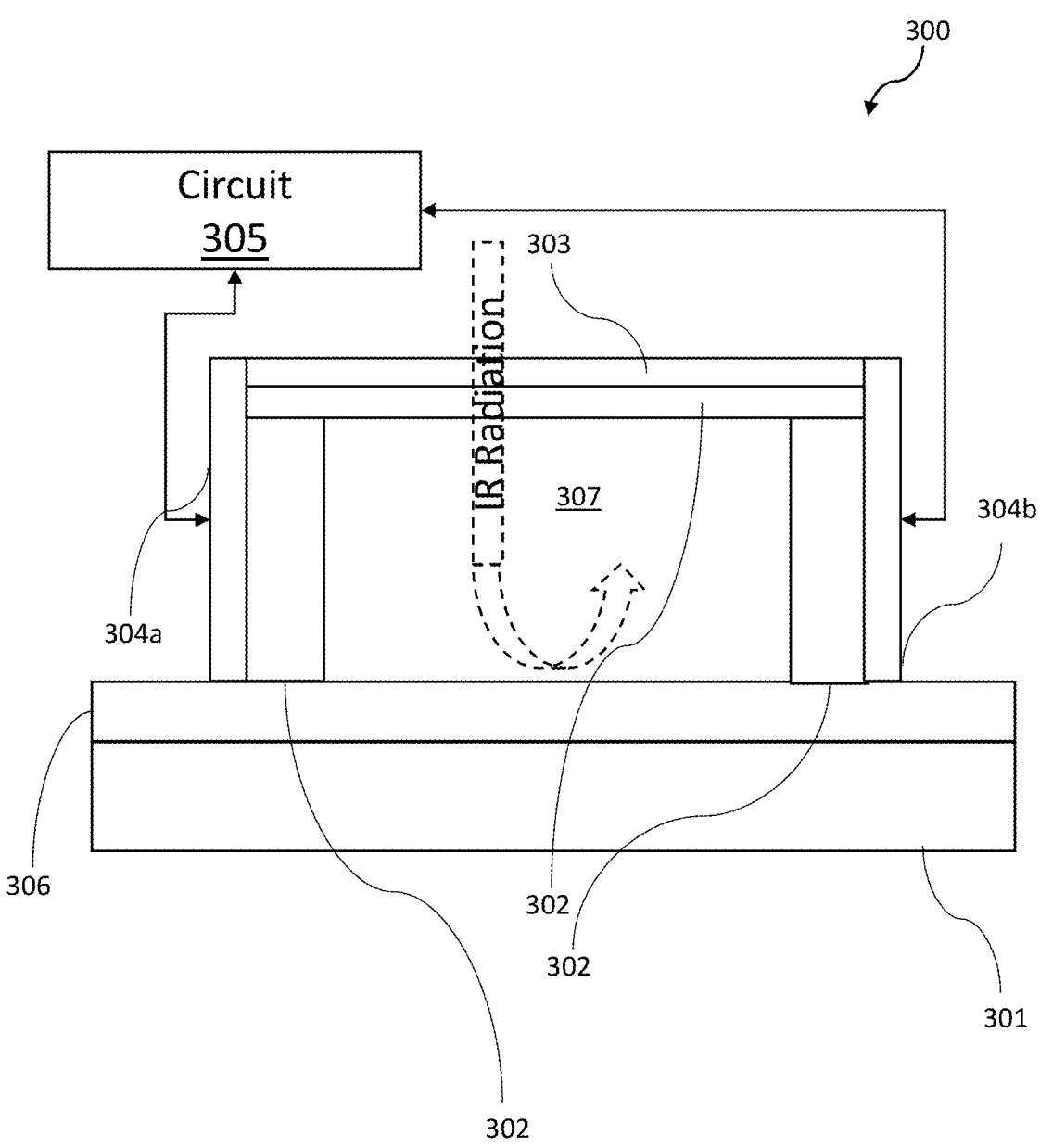
FIG. 7B is a schematic side view of the IR sensor of FIG. 7A.
Figure 8:
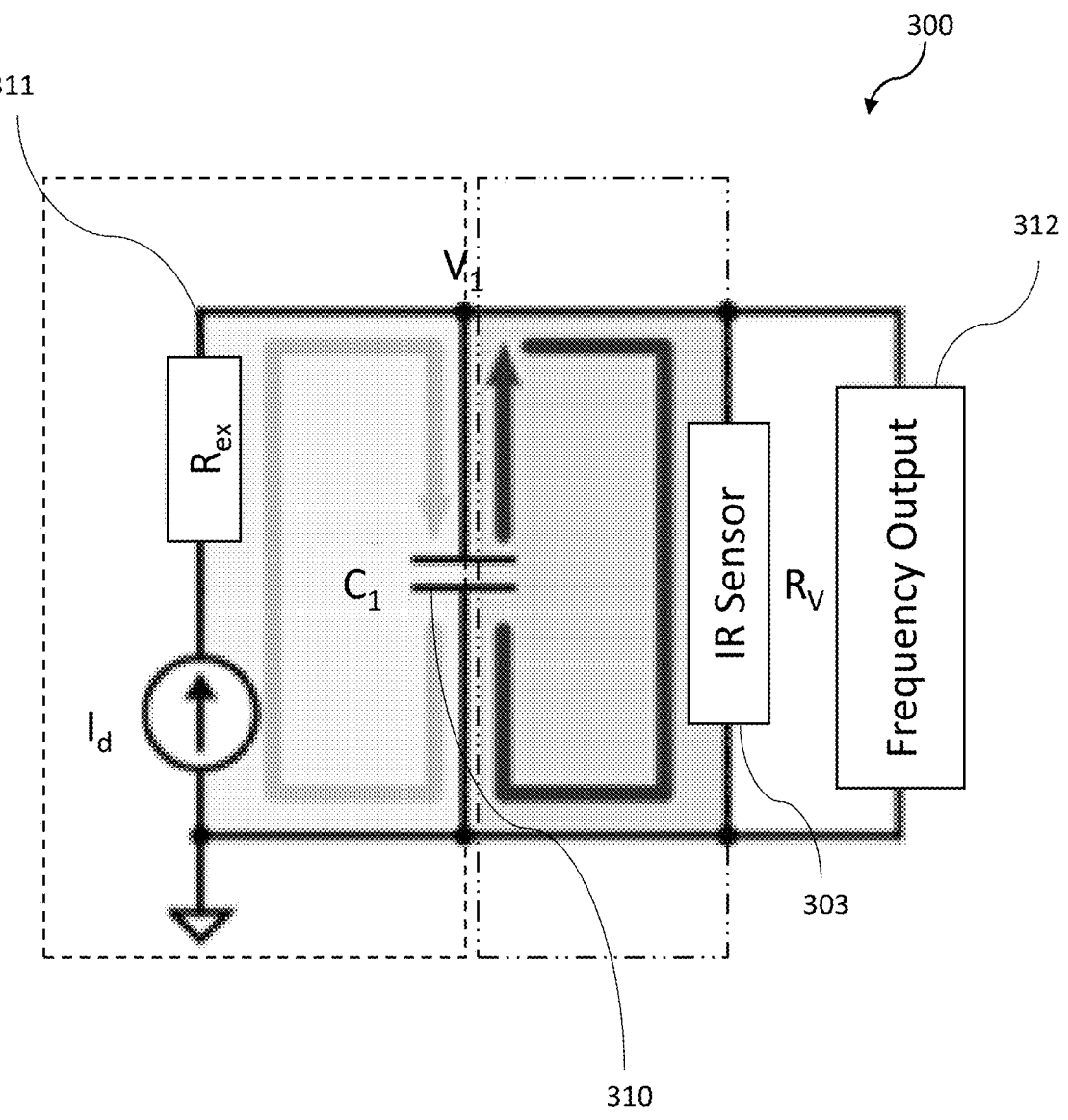
FIG. 8 is a circuit diagram of the IR sensor of FIG. 7A.

The fabricated detector pixel is connected to an electrical circuit as illustrated in FIG. 8. At an appropriate biasing condition, electrical oscillations can be initiated owing to the NDR exhibited by the PCM in the active pixel material stack. The onset of oscillation under current control (CC) mode is depicted in FIGS. 7B & 8. The two halves in the circuit diagram, highlighted by dashed boxes, represent two processes in the oscillation. The dashed box indicates the charging of capacitor $C_1$ when the circuit is first initiated. During this process, the current flow $I_d$ bypasses the active detector pixel ($R_v$) branch due to its high resistance in the insulating phase of $VO_2$, instead charges the capacitor $C_1$.

Following the charging of $C_1$ (with the dot-dot-dash box), the discharging of $C_1$ starts as soon as the voltage $V_1$ across $C_1$ exceeds a certain threshold to drive sufficient current through $R_v$ to induce an IMT due to the increase in local Joule heating. After the IMT, the $VO_2$ film ($R_v$) transits to a metallic phase with considerably lower resistance compared to its insulating phase, resulting in the discharging of capacitor $C_1$. Subsequently, the voltage across $C_1$ ($V_1$) decreases, eventually leading to an MIT in the $VO_2$ film due to the significant decrease in the current/Joule heating. The continuous repetition of these two processes results in the oscillation in current/voltage across the $VO_2$ film. One complete electrical oscillation cycle includes one rise and one fall of the voltage $V_1$ across the $VO_2$ film ($R_v$).

The rise and fall time can be understood as the time required to travel between two threshold voltages $V_{th1}$ and $V_{th2}$, where $V_{th1}$ is the threshold voltage at the end of the $C_1$ charging ($V_1 > V_{th1}$) when the IMT occurs, and $V_{th2}$ is the threshold voltage at the end of $C_1$ discharging ($V_1 < V_{th2}$) when the MIT happens. To acquire the full hysteresis curve of the $VO_2$ phase transition, the change in the voltage across the $VO_2$ film is measured by varying the bias current. An external resistor $R_{ext}$=58 kΩ is added to the circuit to disable electrical oscillation while varying the applied current.

Figure 9:
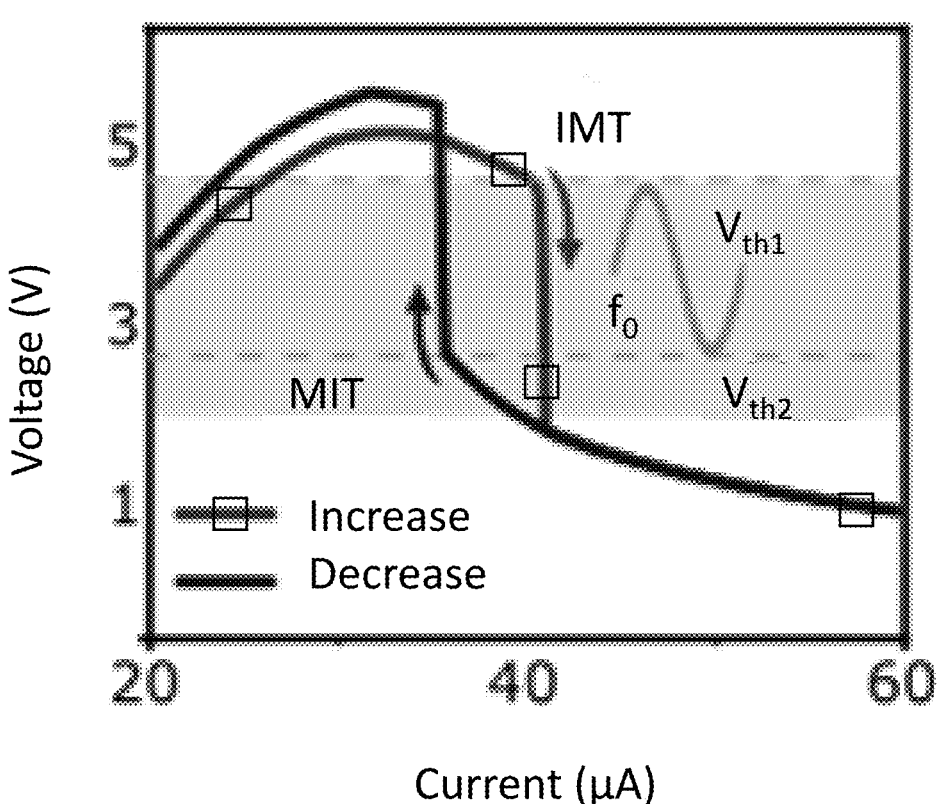
FIG. 9 is a diagram of voltage versus current in the example embodiment of the IR sensor, according to the present disclosure.
Figure 10:
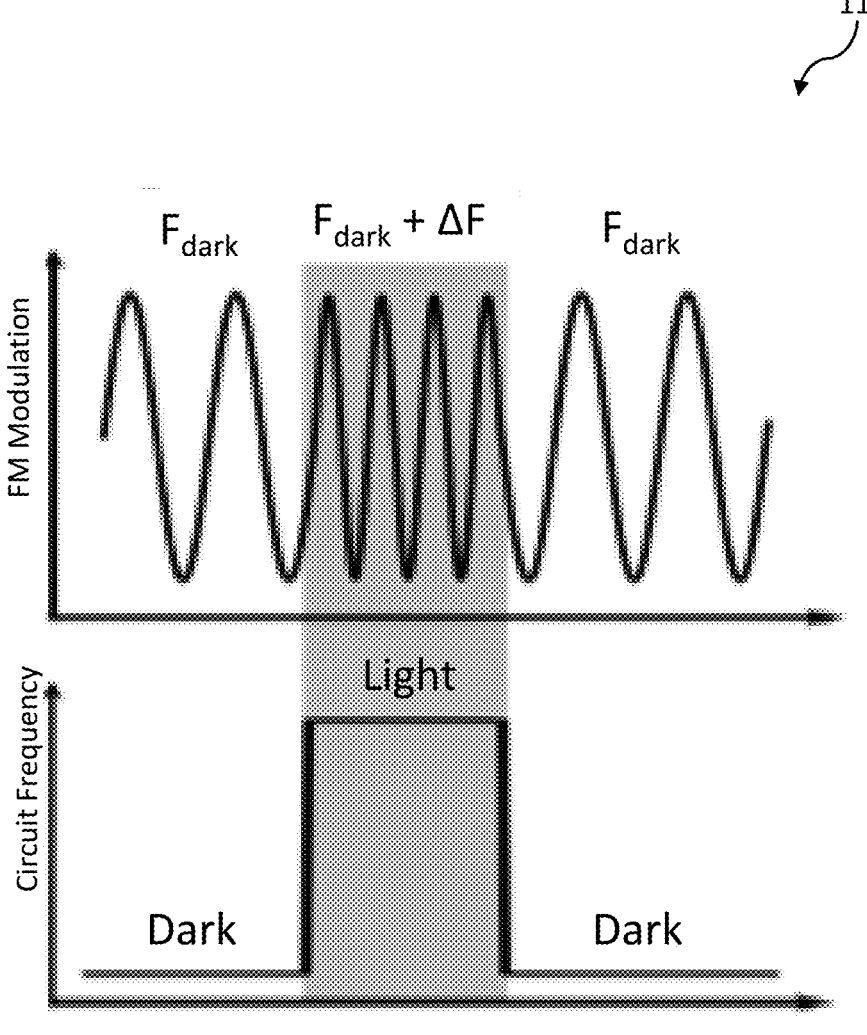
FIG. 10 is a diagram of FM modulation and circuit frequency in the example embodiment of the IR sensor, according to the present disclosure.

FIG. 9 shows a diagram 1160 of current over voltage of the device with an external resistor of 58 kΩ of the disclosed FM-based detection scheme. FIG. 10 shows a diagram 1170 of the working principle of the disclosed FM-based detection scheme. At first, during dark conditions, the circuit oscillates at a frequency of $f_{dark}$. When the detector is illuminated with IR light, it changes the oscillation frequency to $f_{dark}$+Δf. Once the incident light is removed, the oscillation frequency returns to its original frequency. Therefore, by recording the frequency shift Δf, the incoming IR light can be detected.

The absorption spectra of the $VO_2/Si_3N_4$ stack in the insulating (square hatched) and metallic (no hatching) phases are measured and shown in diagram 1060 in FIG. 3A where a significant change in absorption between the two end states is observed. To corroborate the experimental data with numerical calculations, finite difference time domain (FDTD) simulations in Ansys Lumericals are performed, where there is a good agreement between the simulation (dashed) and experimental results (solid). The absorption of the stack during oscillation to be in between the metal and insulating phase absorptions.

FIG. 1B with the diagram 1000 shows two measured electrical oscillation waveforms in dark (circle hatched) and light (triangle hatched) conditions, with the time between the two waveforms adjusted to best present the difference in oscillation frequency. The corresponding oscillation frequencies in the light and dark conditions are displayed in the diagram 1070 of FIG. 3B. For the light illumination, a quantum cascade laser (QCL) of wavelength 8.7 μm is focused on the detector using a parabolic mirror. When the $VO_2$ film with an 8×8 μm$^2$ active sensing area while being driven by a current of 63 μA is illuminated with a 11.5 μW incident power with 300 μm diameter spot size, the oscillation frequency increases by 499 Hz, from 5.007 kHz (dark) to 5.506 kHz (light).

FIG. 9 includes diagrams 1160 of the measured voltage across the $VO_2$ film as a function of the bias current. The sudden drop in the voltage in the square hatched curve while increasing the applied current represents IMT; whereas the sudden bump in the voltage while decreasing the applied current represents MIT. The voltages across the $VO_2$ film ($V_1$) at the transition edges are recorded as the threshold voltages $V_{th1}$ and $V_{th2}$, respectively. During the LWIR exposure of the device, the stack absorbs the light and modifies the phase of $VO_2$ towards metallic phase. Although, this modification is not strong enough to induce the phase transition due to the low intensity of the incident light, it reduces both threshold voltages $V_{th1}$ near IMT and $V_{th2}$ near MIT resulting in the shift in the oscillation frequency.

Figure 11:
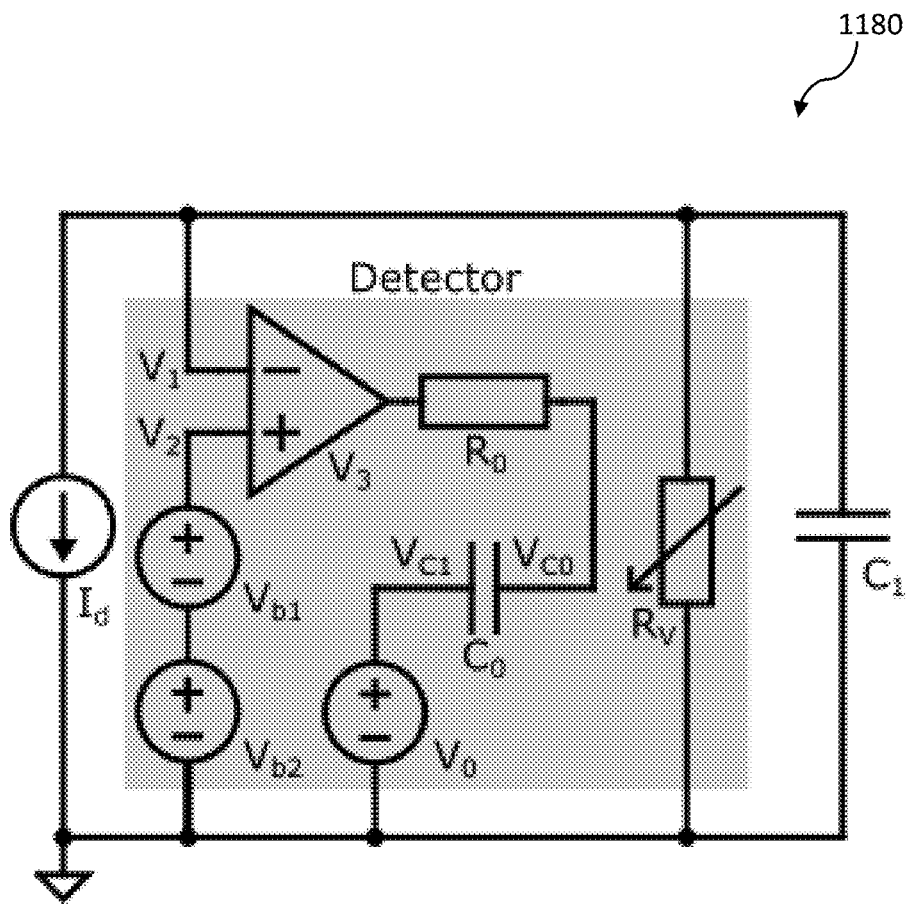
FIG. 11 is a circuit diagram for simulating the example embodiment of the IR sensor, according to the present disclosure.
Figure 12:
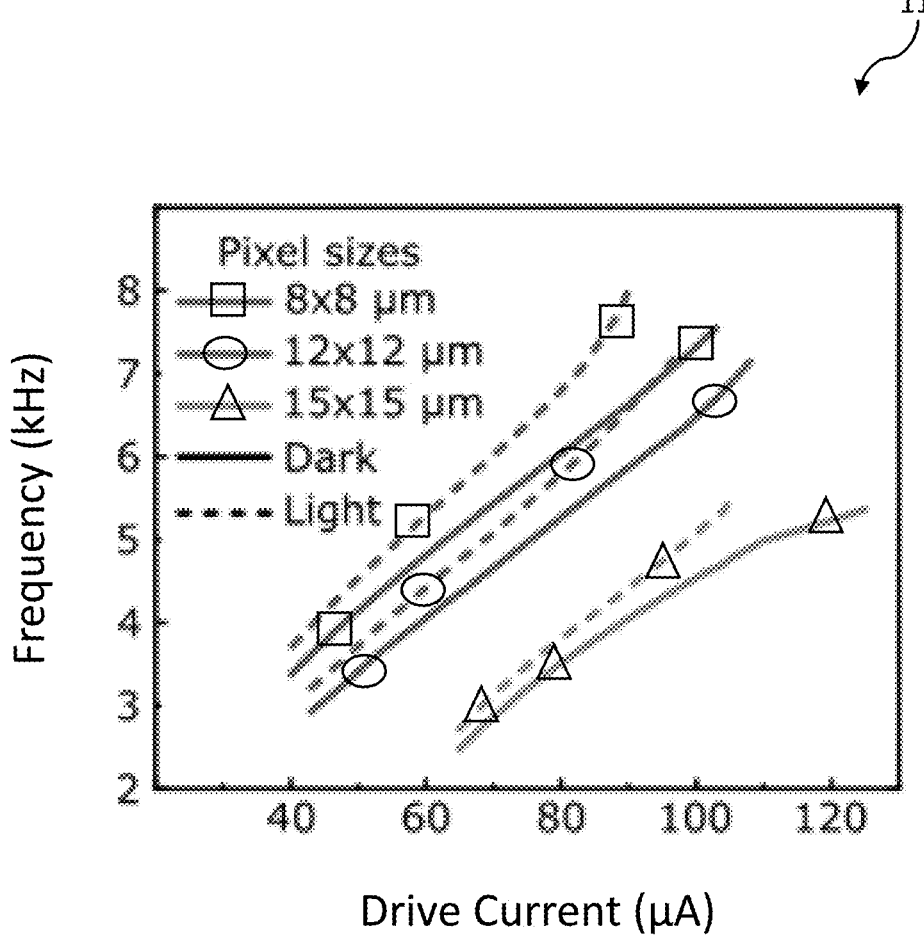
FIG. 12 is a diagram of oscillation frequencies versus drive current with varying IR sensor sizes in the example embodiment of the IR sensor, according to the present disclosure.
Figure 13:
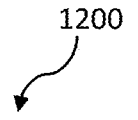
FIG. 13 is a diagram of frequency shift versus drive current with varying IR sensor sizes in the example embodiment of the IR sensor, according to the present disclosure.
Figure 13:
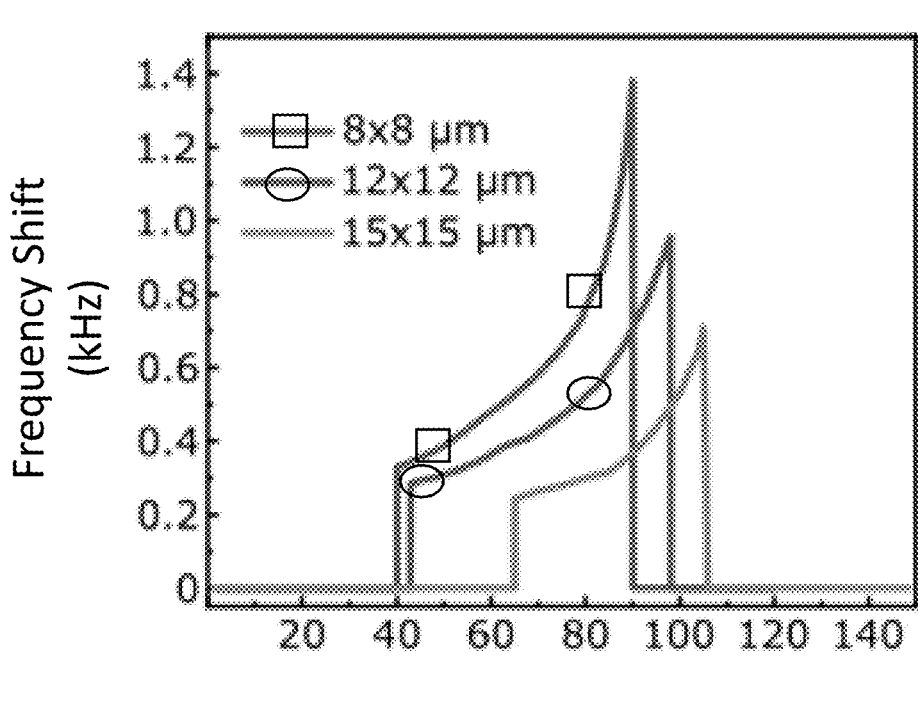
Figure 14:
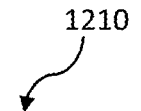
FIG. 14 is a diagram of noise versus drive current in the example embodiment of the IR sensor, according to the present disclosure.
Figure 14:
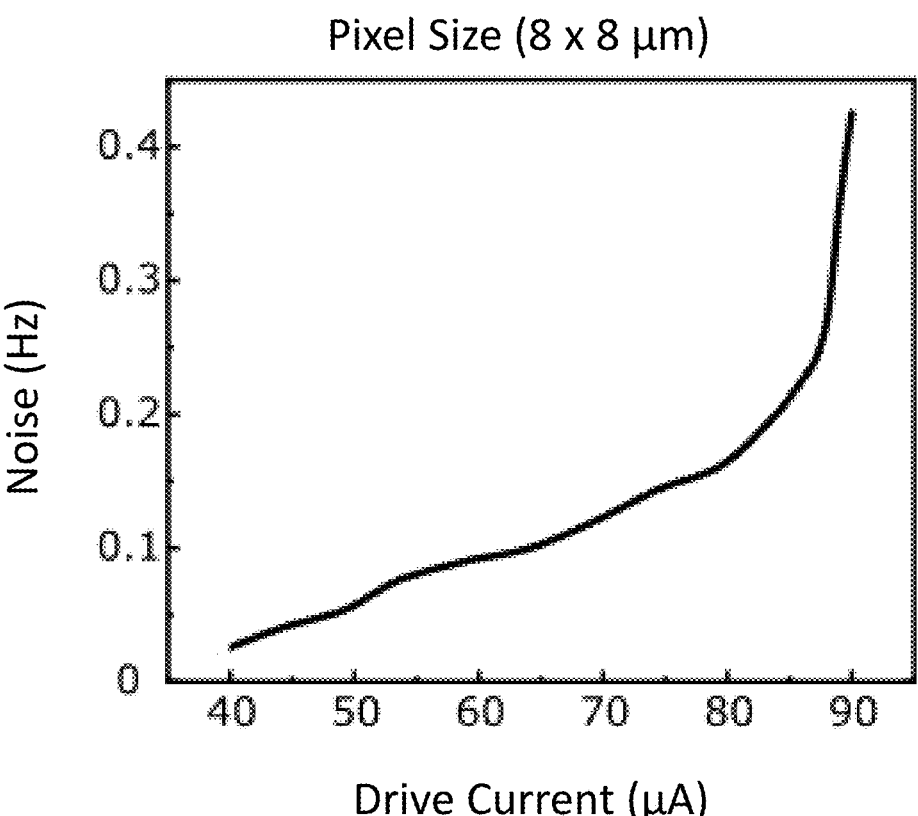

In the following, the equivalent circuit model is discussed for the phase transition of $VO_2$ when it is simultaneously driven by current and electric field (in this case incident IR light). Here, a simulation approach is provided by creating an equivalent circuit of the device in a circuit simulation environment to match and predict the electrical performance of the device. To simulate the oscillation frequency and its light induced modulation, an equivalent circuit model of the device in LTspice was developed, which is illustrated in diagram 1180 of FIG. 11. In this model, the constant current source $I_d$ is the drive current used in the experiment. $R_v$ is a voltage-controlled resistor representing the $VO_2$ film, $C_1$ refers to the capacitance in the system that is connected in parallel to the $VO_2$ film. It should be noted that while $I_d$, $R_v$, and $C_1$ are among the components utilized in the experiment. Additional circuit elements including a voltage comparator ($V_3$), constant voltage sources ($V_{b1}$, $V_{b2}$, $V_0$), a constant resistor ($R_0$) and a capacitor ($C_0$), shown with a gray background are incorporated to imitate the variation of the $VO_2$ film resistance ($R_v$) during phase transition.

Figure 4A:
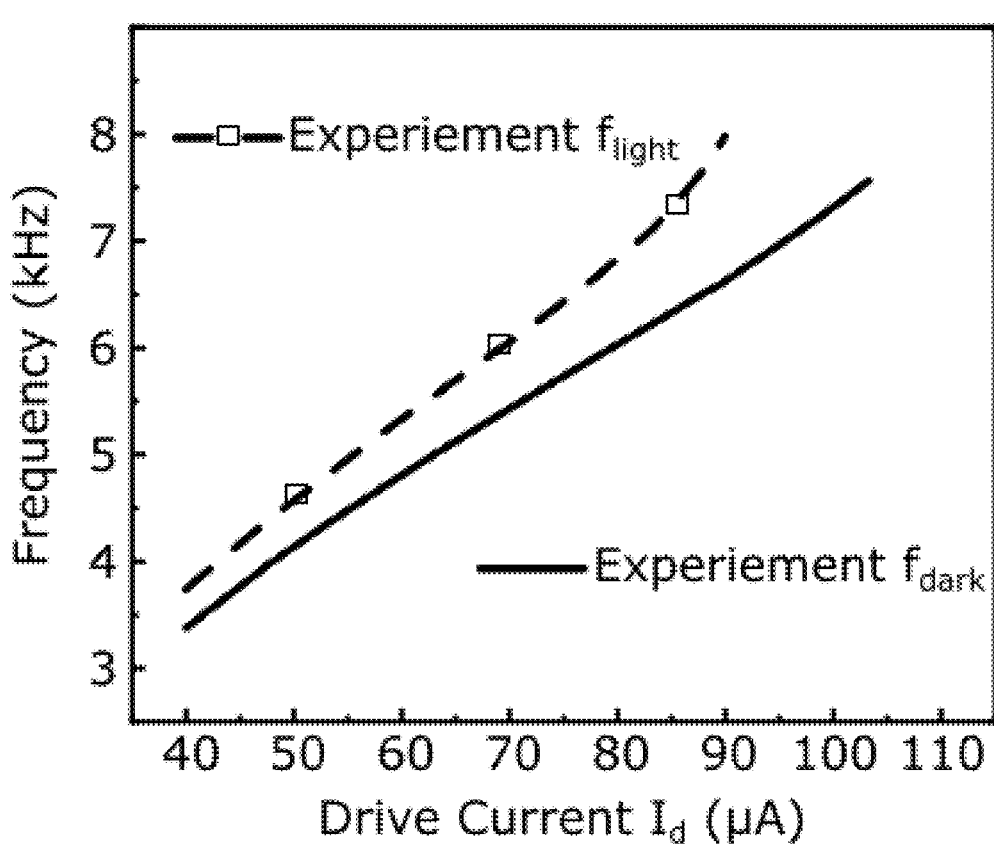
FIG. 4A is a diagram of oscillation frequency in light and dark conditions for the example embodiment of the IR sensor, according to the present disclosure.
Figure 4B:
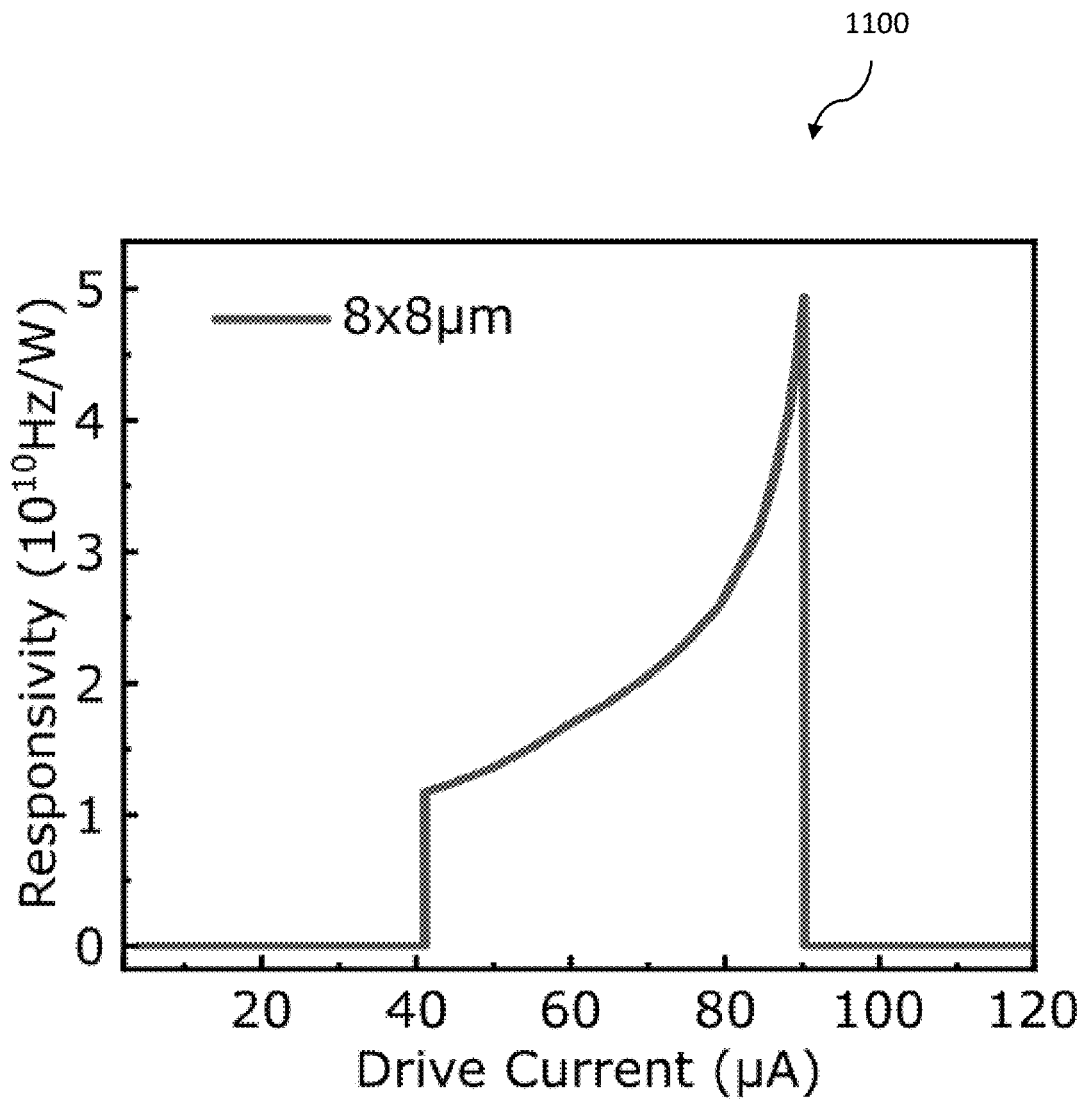
FIG. 4B is a diagram of responsivity as a function of driving current in the example embodiment of the IR sensor, according to the present disclosure.
Figure 4C:
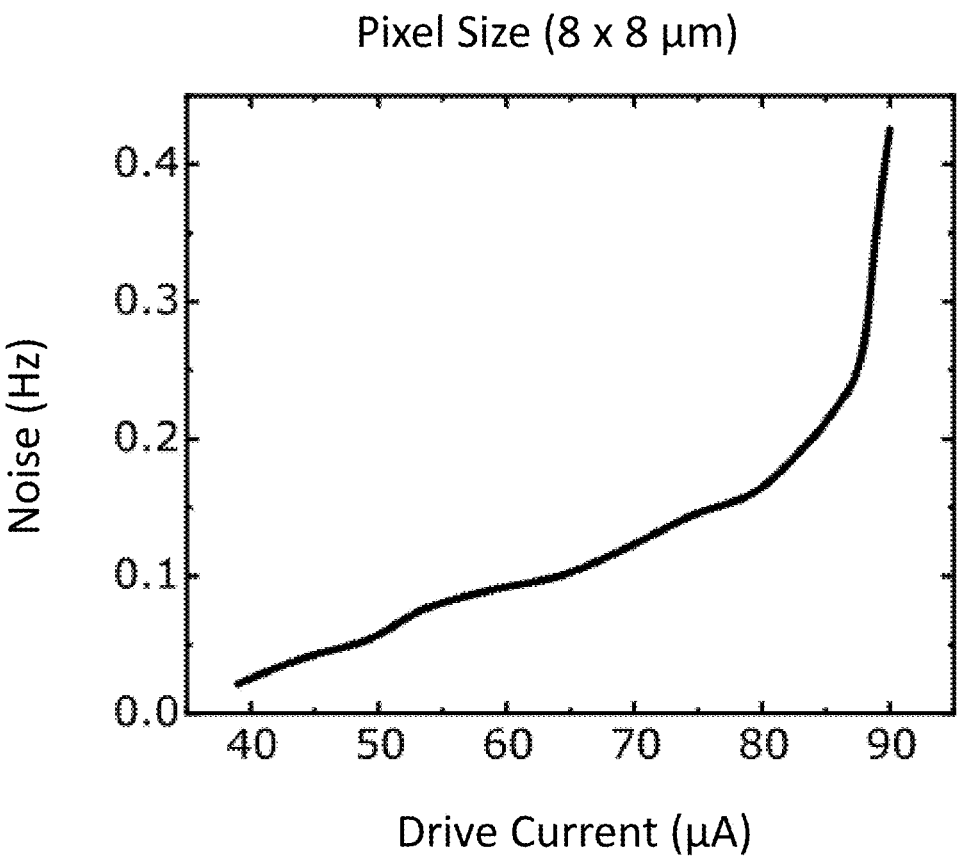
FIG. 4C is a diagram of noise spectral density as a function of driving current in the example embodiment of the IR sensor, according to the present disclosure.
Figure 4D:
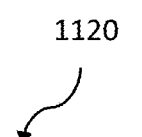
FIG. 4D is a diagram of estimated and measured detectivity as a function of driving current in the example embodiment of the IR sensor, according to the present disclosure.
Figure 4D:
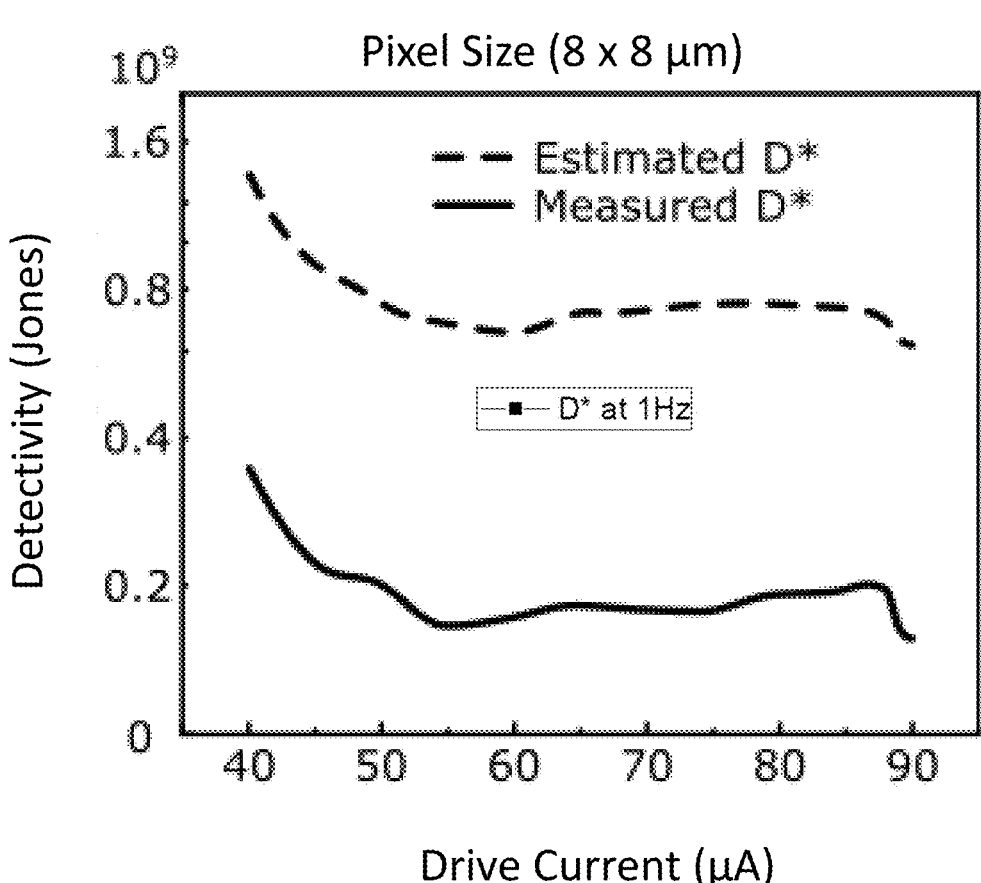

In this simulation, the oscillation frequency of the circuit as a function of drive current during the dark conditions and when illuminated with an 8.7 μm wavelength IR laser is calculated. An increase in the oscillation frequency is observed during the light illumination compared to the dark condition. It should be noted that the circuit can support oscillations in a certain range of the drive current. For the 8×8 μm$^2$ pixel size, oscillation onsets from the drive current at 40 μA and ceases at 108 μA in the dark condition. When the drive current is lower than 40 μA, the voltage $V_1 < V_{th1}$ on the $VO_2$ film stays below the IMT threshold and consequently, no current oscillation exists. On the other hand, with a high drive current above 108 μA, the device makes an IMT but fails to make an MIT afterward due to $V_1 > V_{th2}$ at all the time, and hence the oscillation cannot exist as well. Here, $I_{min}$ and $I_{max}$ are referred to as the minimum and maximum limit currents that support oscillation in the circuit, respectively. The shift in the frequency in presence of light ($\Delta f = f_{light} - f_{dark}$) as a function of drive current for a constant illumination power was simulated. It was observed that Δf increases with the drive current $I_d$. As the drive current $I_d$ approaches the threshold current $I_{th2}$, the increase in Δf is particularly rapid. In FIG. 4A, the experiments demonstrate that the frequency of the circuit increases over a large range of bias current when exposed to light which shows an excellent match with the simulation results.

Figure 15A:
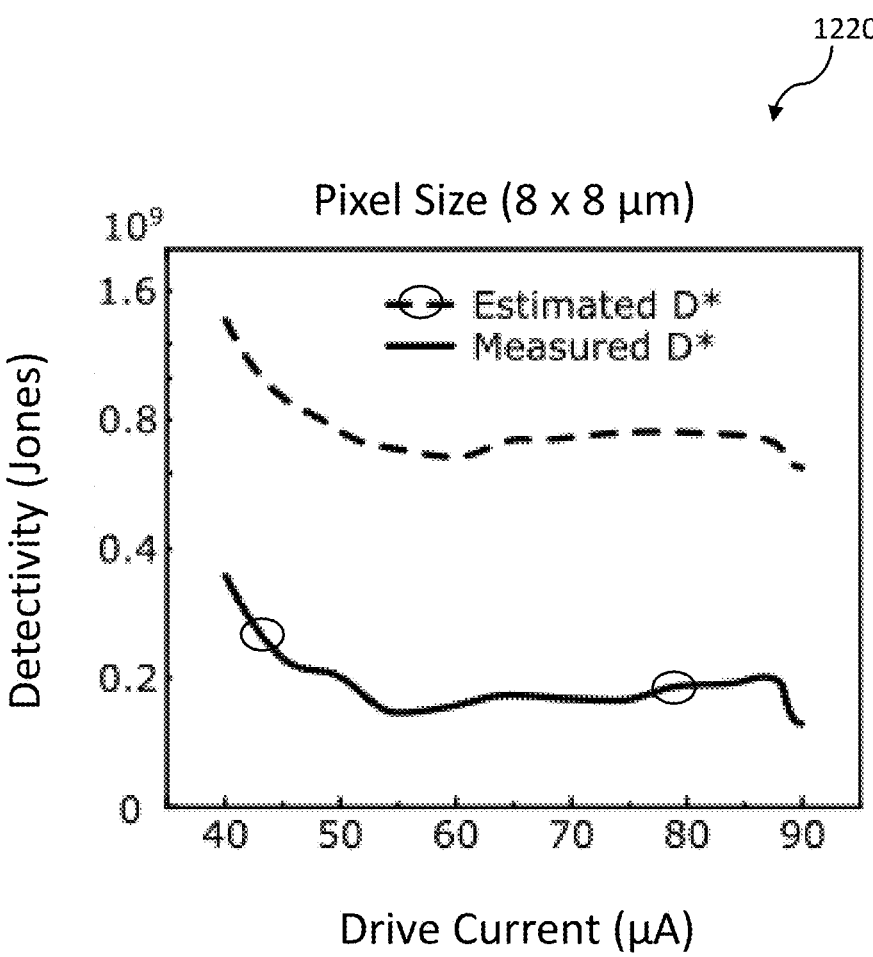
FIG. 15A is a diagram of simulated detectivity and actual detectivity in the example embodiment of the IR sensor, according to the present disclosure.
Figure 15B:
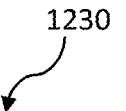
FIG. 15B is a diagram of time response in the example embodiment of the IR sensor, according to the present disclosure.
Figure 15B:
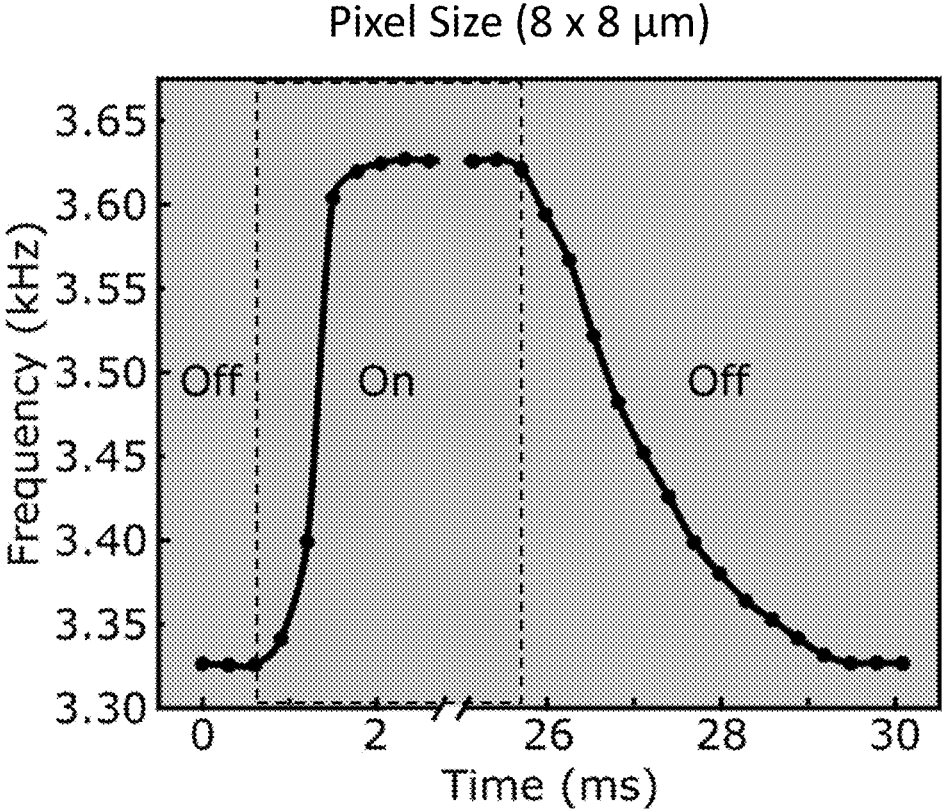

Referring now again to FIGS. 12–14 & 15A, the performance of the detector is assessed in terms of pixel dimensions. For this study, the detectors of three different dimensions 8×8 μm$^2$, 12×12 μm$^2$, and 15×15 μm$^2$ are discussed. Diagrams 1190, 1200, 1210, 1220 show the evolution of the oscillation frequency as a function of drive current for three different pixel sizes in dark and light conditions. The devices, which are smaller in size (8×8 μm$^2$), exhibit the highest oscillation frequency with the same drive current. It is observed that both the limit current $I_{min}$ and $I_{max}$ are larger for the devices with 15×15 μm$^2$ pixel size. Despite the larger operation current, the bigger devices show lower frequency response under the same incident power compared to the smaller devices. The effect of pixel size on the behavior of the devices is attributed to the current density being lower in bigger pixels. The current density (j) in a $VO_2$ film of thickness d, and width w can be expressed as j=I/A, where I is the current across $R_v$, and A=d×w is the cross-section area. It should be noted that in the experiment, all the devices have the same film thickness d=150 nm. However, a bigger pixel with a larger channel width w possesses a larger cross-section area A, leading to a decrease in the current density j under the same drive current $I_d$. Since lower current density decreases local Joule heating in larger pixels, higher drive currents are required to induce the phase transition. In particular, with reference to FIG. 15B, diagram 1230 shows a measured time response of the 8×8 μm$^2$ device with the light switched on (inside the dashed box) and off (outside the dashed box).

Therefore, bigger limit currents $I_{min}$ and $I_{max}$ are observed in the case of larger devices. The decrease in the oscillation frequency with the bigger devices can be explained by the longer time required to travel between two threshold voltages $V_{th1}$ and $V_{th2}$, due to the larger the difference between them $\Delta V = V_{th1} - V_{th2}$ Diagram 1210 shows the corresponding frequency shifts of three different pixel-size detectors. While the device with the dimension of 8×8 $\mu m^2$ exhibits the largest frequency shift, all three sizes show a similar trend as a function of drive current. From the frequency shift, the responsivity $\mathcal{R}$ can be determined as follows:

$$\mathcal{R}=\Delta f/P_{inc} \qquad (1)$$

where $P_{inc}$ is the incident power on the active region of the device.

It is to be noted that since the spot diameter of the laser is 300 $\mu m$, $P_{inc}$ is only a fraction of the total incident power. Therefore, from these measurements, it can be inferred that better responsivity is expected for devices with smaller pixel sizes. Further, the sensitivity of the device with 8×8 $\mu m^2$ active pixel area is assessed by measuring the detectivity (D*) as a function of drive current. The D* is defined by the expression $$D^*=\sqrt{A}/NEP \qquad (2)$$

where, A is the active area of the detector and NEP is the noise equivalent power. NEP can be determined by:

$$NEP=S_n/\mathcal{R} \qquad (3)$$

where $S_n$ is the noise spectral density calculated at 1 Hz by a waveform measurement with Shannon-Nyquist sampling theorem. It should be noted that all the measurements of the oscillation frequency are done by the peak-to-peak method with the recorded waveforms. The minimum time needed for one frequency measurement is equal to the periodicity of the waveform. Thus, the cut-off frequency equals to the oscillation frequency of the circuit shown in diagram 1190.

The evolution of the noise as a function of the drive current is plotted in diagram 1210. As the drive current increases, the noise ($S_n$) also increases because the device approaches the metallic phase. This is attributed to the increased instability of $V_{th1}$ and $V_{th1}$–$V_{th2}$ with a high drive current. The oval hatched graph in diagram 1220 displays the measured D* of the device as a function of the drive current.

This measurement demonstrates that when the drive current is set to the smallest value of 40 $\mu A$, producing the lowest noise $S_n$, the highest measured D* of 3.8×10⁸ Jones is obtained for these fabricated detectors. As the drive current increases, the value of $S_n$ also increases, leading to a corresponding decrease in D*. This decrease in D* continues until a certain drive current is attained, after which it remains mostly constant. The capacitance of the measurement setup is estimated to be about 6 nF by matching experimental result with the equivalent circuit model prediction. It is worth noting that if the capacitance in parallel with the $VO_2$ film is reduced or the electrical circuit's instability is decreased, the sensitivity of the proposed FM-based detector for room temperature use will be further enhanced. Therefore, the predicted D* of the device with 1 nF capacitance is represented by the solid curve in diagram 1220, demonstrating a five-fold improvement the D* value is achievable. For a drive current of 40 $\mu A$, it is anticipated that the highest expected D* will be around 1.5×10⁹ Jones, which is comparable to D* of a cryogenically-cooled LWIR detector.

Next, the dependency of the frequency response of the device to the incident IR power is investigated. As discussed previously, the spot size of the excitation laser, with a wavelength of 8.7 $\mu m$, is much larger than the active area of the detector, which is 8×8 $\mu m^2$. Therefore, an accurate estimation of the incident power on the active area of the detector is necessary. For this purpose, the beam profile of the incident laser in form of a frequency shift map by scanning the detector within the focal plane of the incident laser is obtained. The parabolic mirror used to focus the laser is shifted in increments of 10 $\mu m$ with a motorized XY stage in order to scan the detector within the laser spot. The incident power $P_{inc}$ on the active area of the detector is finally calculated by picking out the center 8×8 $\mu m^2$ region of the measured frequency shift map as:

$$P_{inc}=(\Delta f_d/\Delta f_{map})\times P_{map} \qquad (4)$$

where $\Delta f_d$ is the integrated frequency shift over the center 8×8 $\mu m^2$ region of the map; $\Delta f_{map}$ is the integrated frequency shift of the whole map; and $P_{map}$ is the total incident power which is measured in front of the parabolic mirror by a power meter.

The same measurements are performed to determine the incident laser power for the estimation of $\mathcal{R}$, NEP, and D*. When measuring the shift in oscillation frequency $\Delta f$ as a function of incident laser power for an 8×8 $\mu m^2$ device, the power of the laser is varied using neutral density filters before the parabolic mirror. A linear relationship is observed for a large range of incident power from 4.54 nW to 63.4 nW. The device position relative to the beam is carefully adjusted and placed at the center of the beam by scanning the beam profile for each incident power at the start of the measurement. This new concept opens up the possibility of realizing an FM-based uncooled multi-pixel IR camera. To demonstrate the real performance of our LWIR detector, a single-pixel imaging experiment was conducted.

In summary, with the present disclosure, an FM-based uncooled LWIR detector using a cavity-coupled PCM is disclosed. The FM-based detection scheme possesses inherent robustness against noise compared to conventional AM-based detection schemes, providing significant improvement in sensitivity and signal-to-noise ratio while minimizing the influence of external interference. The measured detectivity of the proposed detector is higher than commercially-available uncooled LWIR detectors and comparable to the cryogenically-cooled detectors. Proper industrial packaging with low capacitance circuit components can further increase the detectivity. Notably, the detector exhibits a highly desirable linear response and high detectivity at room temperature, rendering it a solution for diverse applications.

Furthermore, the feasibility of developing a multi-pixel IR camera with these detectors through single-pixel imaging is a potential application. Although $VO_2$ was used as the PCM in the disclosed exemplary embodiments, this detection scheme can be extended to other PCMs exhibiting NDR, and different spectral regions of light can be covered depending on the absorption properties of the material. The operational wavelength may also be tuned by changing the cavity thickness. The disclosed FM-based detector is a unique platform for creating low-cost, high-efficiency uncooled IR detectors for various applications, such as remote sensing, thermal imaging, and medical diagnostics.

Figure 6:
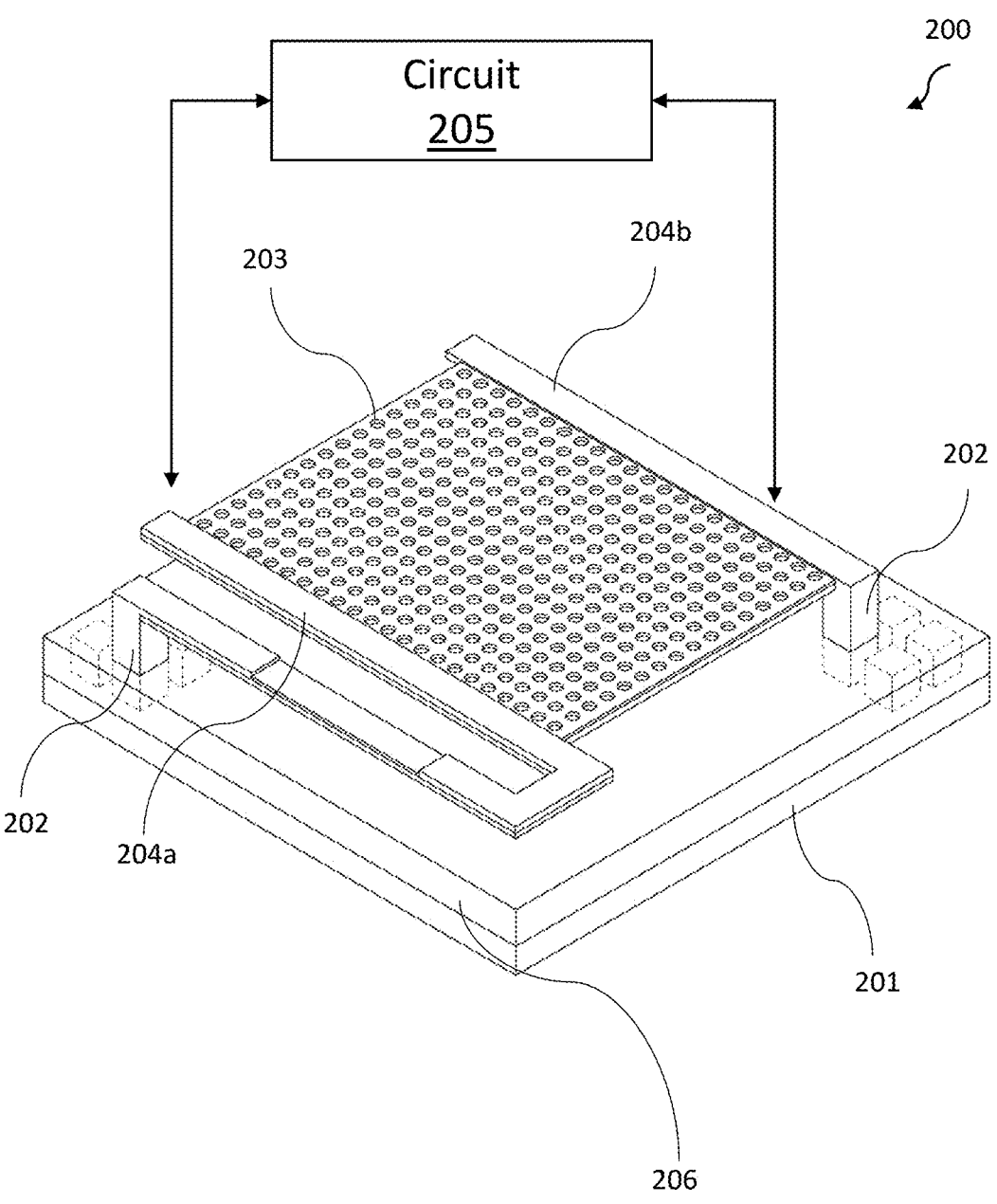
FIG. 6 is a schematic perspective view of the IR sensor, according to a second embodiment of the present disclosure.

Referring now additionally to FIG. 6, another embodiment of the IR sensor 200 is now described. The IR sensor 200 includes a substrate 201, a support layer 202 carried by the substrate, a PCM layer 203 carried by the support layer, first and second electrically conductive contacts 204a-304b carried by the substrate and coupled to opposing sides of the PCM layer, and a circuit 205 coupled to the first and second electrically conductive contacts. The IR sensor 200 includes a rear reflector 206 on the substrate 201 and spaced apart from the PCM layer 203. Also, the PCM layer 203 is illustratively decorated with plasmonic structures (e.g., grid of cylinder shaped plasmonic structures). In other embodiments, the PCM layer 203 is decorated partially of the surface.

Referring now to FIGS. 7A-7B & 8, an IR sensor 300 according to the present disclosure is now described. The IR sensor 300 includes a substrate 301, a support layer 302 carried by the substrate, a PCM layer 303 carried by the support layer, first and second electrically conductive contacts 304a-304b carried by the substrate and coupled to opposing sides of the PCM layer, and a circuit 305 coupled to the first and second electrically conductive contacts.

For example, the PCM layer 303 may include vanadium dioxide. Of course, in other embodiments, other PCMs may be used. The substrate 301 may include silicon oxide, or some other stable dielectric material. Also, for example, the support layer 302 may include at least one of silicon oxide, silicon nitride, and sapphire; and the first and second electrically conductive contacts 304a-304b each may include chromium.

The circuit 305 is configured to apply an electrical bias signal to the PCM layer 303 to generate an oscillation signal, and detect changes in the oscillation signal based upon IR radiation received by the PCM layer. In particular, the circuit 305 is configured to detect change in the frequency of the oscillation signal based upon the IR radiation received by the PCM layer 303. The electrical bias signal may cause the PCM layer 303 to change phase periodically. Also, the circuit 305 is configured to detect changes in the oscillation signal based upon LWIR radiation, for example, received by the PCM layer 303. Of course, in other embodiments, the IR sensor 300 may be configured to detect other forms of IR radiation.

In the illustrated embodiment, the IR sensor 300 includes a rear reflector 306 on the substrate 301 and spaced apart from the PCM layer 303. The PCM layer 303 and the rear reflector 306 define an optical cavity 307 therebetween. The optical cavity 307 illustratively includes an open optical cavity filled with gas, for example, atmospheric air.

As perhaps best seen in FIG. 8, the circuit 305 illustratively include a capacitor 310 coupled in parallel to the first and second electrically conductive contacts 304a-304b, and a resistor 311 coupled in parallel to the first and second electrically conductive contacts. The circuit 305 also includes a frequency output module 312 coupled to the IR sensor 300. For example, the frequency output module 312 may comprise an oscilloscope.

On the left side, noted with the dashed box, the charge cycle of operation for the IR sensor 300 is shown. On the right side, noted with the dot-dot-dash box, the discharge cycle of operation for the IR sensor 300 is shown. As described hereinabove, the IR sensor 300 cycles between the two states at an oscillation frequency dependent of the physical characteristics of the IR sensor 300. When IR radiation, for example, LWIR radiation, is received by the IR sensor 300, the oscillation frequency is changed, which is detected by the frequency output module 312.

Another aspect is directed to a method for operating an IR sensor 300 comprising a substrate 301, a support layer 302 carried by the substrate, a PCM layer 303 carried by the support layer, and first and second electrically conductive contacts 304a-304b carried by the substrate and coupled to opposing sides of the PCM layer. The method includes applying an electrical bias signal to the first and second electrically conductive contacts 304a-304b of the PCM layer 303 to generate an oscillation signal, and detecting changes in the oscillation signal based upon IR radiation received by the PCM layer.

Figure 16A:
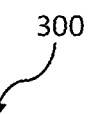
FIGS. 16A-16C are schematic side views of manufacturing the example embodiment of the IR sensor, according to the present disclosure.
Figure 16A:
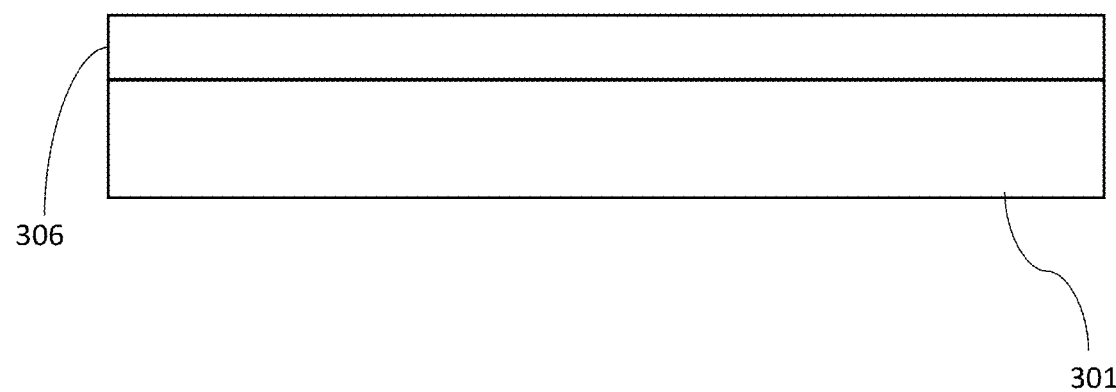
Figure 16B:
Figure 16B:
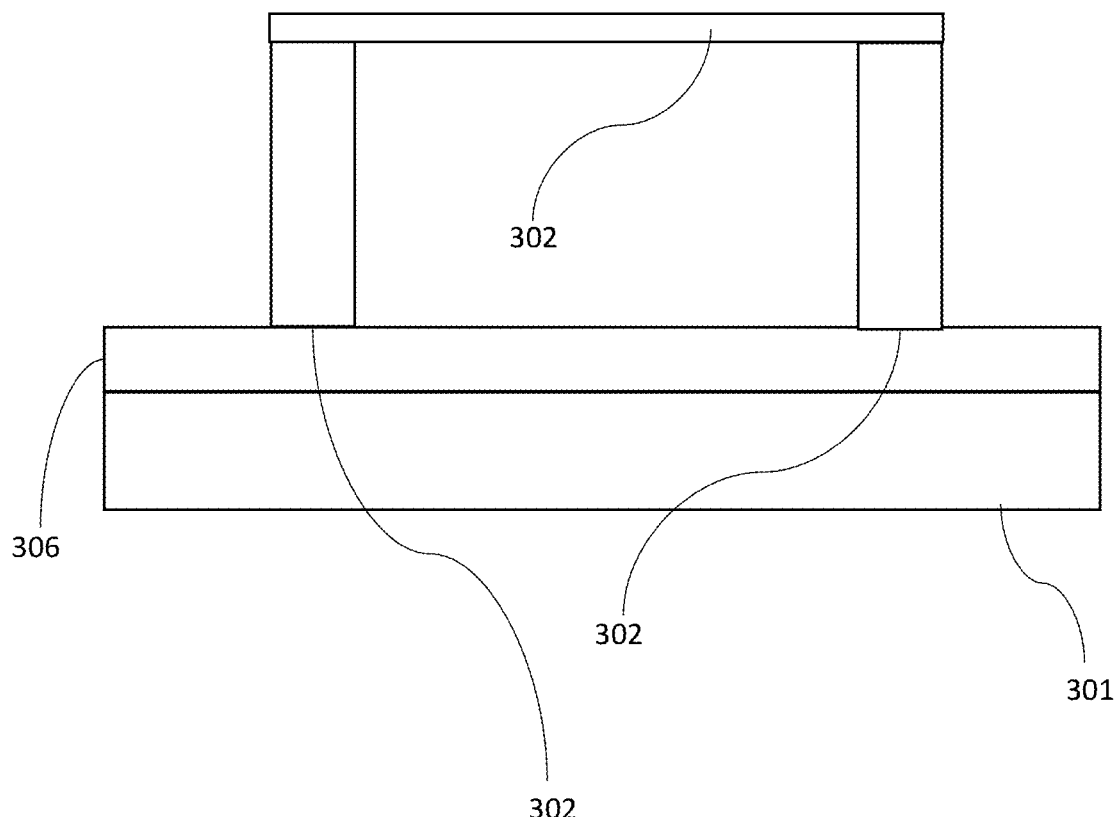
Figure 16C:
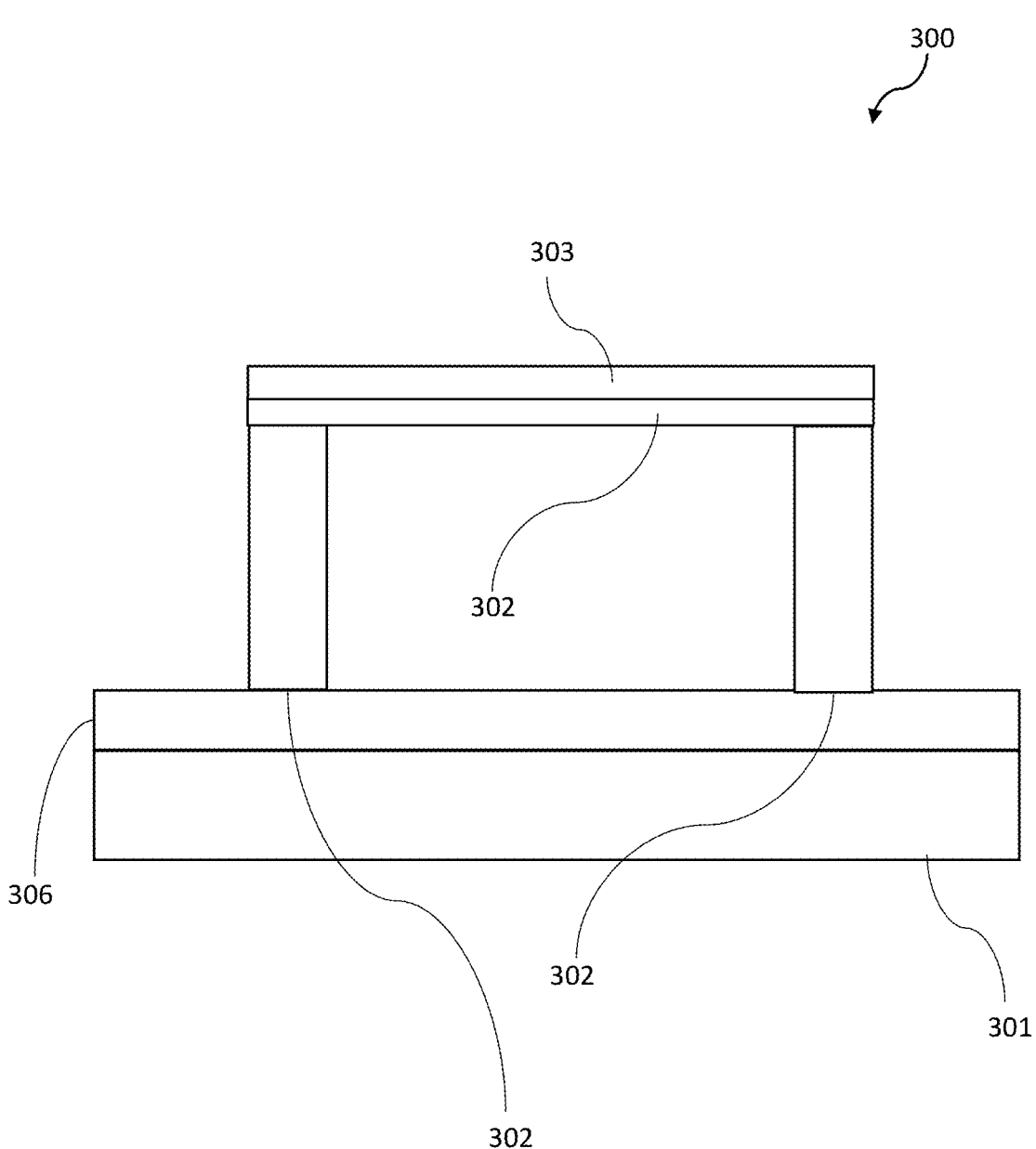

Referring now additionally to FIGS. 16A-16C & 7B, a method for making the IR sensor 300 according to the present disclosure. In FIG. 16A, the method includes forming a rear reflector 306 on a substrate 301. In FIG. 16B, the method includes forming a support layer 302 on the substrate 301. In FIG. 16C, the method includes forming a PCM layer 303 on the support layer 302. The method comprises forming first and second electrically conductive contacts 304a-304b on the substrate 301 and coupled to opposing sides of the PCM layer 303, providing the device shown in FIG. 7B. The method also includes coupling a circuit 305 to the first and second electrically conductive contacts 304a-304b. The circuit 305 is configured to apply an electrical bias signal to the PCM layer 303 to generate an oscillation signal, and detect changes in the oscillation signal based upon IR radiation received by the PCM layer.

In an example embodiment, as shown in FIG. 16A, the method includes forming a 120 nm thick Au mirror on $SiO_2$ (300 nm)/Si(500 µm) substrate 301 by UV-photolithography and e-beam metal deposition. Then, the method may include patterning polyimide with UV-photolithography assisted by a photoresist mask. This is then cured at 350° C. under vacuum for 5 hours. The method may include depositing 200 nm $Si_3N_4$ on the sample by plasma enhanced chemical vapor deposition (PECVD). The method may comprise patterning out the support layer 302 of the $Si_3N_4$ by UV-photolithography and reactive ion etching (RIE) with $CF_4$. Next, the method may include forming the PCM layer 303 by depositing a 150 nm $VO_2$ film on the $Si_3N_4$ structure through magnetron sputtering. The method may include forming the first and second electrically conductive contacts 304a-304b by patterning by UV-photolithography 60 nm chromium deposition. Finally, the method may include forming the PCM layer 303 with the $VO_2$ film patterned into microfilms by UV-photolithography, followed by reactive-ion etching with $SF_6$.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An infrared (IR) sensor comprising:
a substrate;
a rear reflector on the substrate;
a support layer carried by the substrate;
a phase change material (PCM) layer carried by the support layer, the rear reflector being spaced apart from the PCM layer, the PCM layer and the rear reflector defining an optical cavity therebetween;
first and second electrically conductive contacts carried by the substrate and coupled to opposing sides of the PCM layer; and
a circuit coupled to the first and second electrically conductive contacts and configured to
apply an electrical bias signal to the PCM layer to cause an oscillation signal to be generated within the PCM layer, and
detect frequency changes in the oscillation signal based upon IR radiation received by the PCM layer.

2. The IR sensor of claim 1 wherein the circuit is configured to detect a frequency modulation (FM) of the oscillation signal based upon the IR radiation received by the PCM layer.

3. The IR sensor of claim 1 wherein the electrical bias signal causes the PCM layer to change phase periodically.

4. The IR sensor of claim 1 wherein the optical cavity comprises an open optical cavity.

5. The IR sensor of claim 1 wherein the circuit is configured to detect changes in the oscillation signal based upon longwave infrared (LWIR) radiation received by the PCM layer.

6. The IR sensor of claim 1 wherein the circuit comprises a capacitor coupled in parallel to the first and second electrically conductive contacts, and a resistor coupled in parallel to the first and second electrically conductive contacts.

7. The IR sensor of claim 1 wherein the PCM layer comprises vanadium dioxide.

8. The IR sensor of claim 1 wherein the substrate comprises silicon oxide; wherein the support layer comprises at least one of silicon oxide, silicon nitride, and sapphire; and wherein the first and second electrically conductive contacts each comprises chromium.

9. A method for operating an infrared (IR) sensor comprising a substrate, a support layer carried by the substrate, a phase change material (PCM) layer carried by the support layer, a rear reflector on the substrate and being spaced apart from the PCM layer, the PCM layer and the rear reflector defining an optical cavity therebetween, and first and second electrically conductive contacts carried by the substrate and coupled to opposing sides of the PCM layer, the method comprising:

applying an electrical bias signal to the first and second electrically conductive contacts of the PCM layer to cause an oscillation signal to be generated within the PCM layer; and detecting frequency changes in the oscillation signal based upon IR radiation received by the PCM layer.

10. The method of claim 9 wherein the detecting of change comprises detecting a frequency modulation (FM) of the oscillation signal based upon the IR radiation received by the PCM layer.

11. The method of claim 9 wherein the oscillation signal causes the PCM layer to change phase periodically.

12. The method of claim 9 wherein the detecting of change comprises detecting changes in the oscillation signal based upon longwave infrared (LWIR) radiation received by the PCM layer.

13. The method of claim 9 further comprising operating a capacitor coupled in parallel to the first and second electrically conductive contacts, and a resistor coupled in parallel to the first and second electrically conductive contacts.

14. The method of claim 9 wherein the PCM layer comprises vanadium dioxide; wherein the substrate comprises silicon oxide; wherein the support layer comprises at least one of silicon oxide, silicon nitride, and sapphire; and wherein the first and second electrically conductive contacts each comprises chromium.

15. A method for making an infrared (IR) sensor comprising:

forming a rear reflector on a substrate, the forming of the rear reflector comprising a deposition of metallic material on the substrate;

forming a support layer on the substrate;

forming a phase change material (PCM) layer on the support layer;

forming first and second electrically conductive contacts on the substrate and coupled to opposing sides of the PCM layer; and coupling a circuit coupled to the first and second electrically conductive contacts, the circuit configured to apply an electrical bias signal to the PCM layer to cause an oscillation signal to be generated within the PCM layer, and detect frequency changes in the oscillation signal based upon IR radiation received by the PCM layer.

16. The method of claim 15 wherein the forming of the support layer comprises a chemical vapor deposition on the substrate.

17. The method of claim 15 wherein the forming of the PCM layer comprises a sputtering of the PCM layer.

18. The method of claim 15 wherein the circuit is configured to detect a frequency modulation (FM) of the oscillation signal based upon the IR radiation received by the PCM layer.

19. The method of claim 15 wherein the electrical bias signal causes the PCM layer to change phase periodically.

20. The method of claim 15 wherein the rear reflector is spaced apart from the PCM layer, the PCM layer and the rear reflector defining an optical cavity therebetween; and wherein the optical cavity comprises an open optical cavity.

\*    \*    \*    \*    \*